(12) United States Patent
Chen et al.

(10) Patent No.: US 7,868,314 B2
(45) Date of Patent: Jan. 11, 2011

(54) PHASE CHANGE MEMORY DEVICE AND FABRICATING METHOD THEREFOR

(75) Inventors: Wei-Su Chen, Hsin-Chu (TW); Yi-Chan Chen, Hsin-Chu (TW); Wen-Han Wang, Hsin-Chu (TW); Hong-Hui Hsu, Hsin-Chu (TW); Chien-Min Lee, Hsin-Chu (TW); Yen Chuo, Hsin-Chu (TW); Te-Sheng Chao, Hsin-Chu (TW); Min-Hung Lee, Hsin-Chu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/547,744

(22) Filed: Aug. 26, 2009

(65) Prior Publication Data

US 2010/0140583 A1    Jun. 10, 2010

Related U.S. Application Data

(62) Division of application No. 11/479,497, filed on Jun. 30, 2006, now Pat. No. 7,598,113.

(30) Foreign Application Priority Data

Dec. 28, 2005    (TW) .............................. 94146978 A

(51) Int. Cl.
*H01L 47/00*    (2006.01)
(52) U.S. Cl. .............. 257/4; 257/E47.001; 257/E45.002
(58) Field of Classification Search ................... 438/95, 438/102; 257/4, E45.001, E45.002, E47.005, 257/E47.001, E21.072, E21.075
See application file for complete search history.

(56) References Cited

U.S. PATENT DOCUMENTS

| | | | | |
|---|---|---|---|---|
| 5,837,564 A | * | 11/1998 | Sandhu et al. | ................. 438/95 |
| 6,589,714 B2 | * | 7/2003 | Maimon et al. | ............. 430/313 |
| 6,617,192 B1 | * | 9/2003 | Lowrey et al. | ................. 438/95 |
| 6,750,079 B2 | * | 6/2004 | Lowrey et al. | ................. 438/95 |
| 6,764,897 B2 | * | 7/2004 | Lowrey et al. | ............. 438/238 |
| 6,927,093 B2 | * | 8/2005 | Lowrey et al. | ................. 438/95 |
| 6,943,365 B2 | * | 9/2005 | Lowrey et al. | ................... 257/3 |

(Continued)

FOREIGN PATENT DOCUMENTS

CN    101000945    *    7/2007

*Primary Examiner*—Mary Wilczewski
(74) *Attorney, Agent, or Firm*—Tim Tingkang Xia; Morris, Manning & Martin, LLP

(57) ABSTRACT

A phase change memory device and fabricating method are provided. A disk-shaped phase change layer is buried within the insulating material. A center via and ring via are formed by a lithography. The center via is located in the center of the phase change layer and passes through the phase change layer, and the ring via takes the center via as a center. A heating electrode within the center via performs Joule heating of the phase change layer, and the contact area between the phase change layer and the heating electrode is reduced by controlling the thickness of the phase change layer. Furthermore, a second electrode within the ring via dissipates the heat transmitted to the contact interface between the phase change layers, so as to avoid transmitting the heat to the etching boundary at the periphery of the phase change layer.

12 Claims, 23 Drawing Sheets

U.S. PATENT DOCUMENTS

| | | | |
|---|---|---|---|
| 7,092,286 B2* | 8/2006 | Lowrey et al. | 365/163 |
| 7,254,059 B2* | 8/2007 | Li et al. | 365/185.03 |
| 7,387,938 B2* | 6/2008 | Hideki | 438/385 |
| 2005/0003602 A1* | 1/2005 | Lowrey et al. | 438/202 |
| 2005/0201136 A1* | 9/2005 | Lowrey et al. | 365/100 |
| 2006/0003515 A1* | 1/2006 | Chang | 438/210 |
| 2006/0077706 A1* | 4/2006 | Li et al. | 365/163 |
| 2006/0274575 A1* | 12/2006 | Lowrey et al. | 365/163 |
| 2007/0148855 A1* | 6/2007 | Chen et al. | 438/238 |
| 2007/0249083 A1* | 10/2007 | Li et al. | 438/54 |
| 2007/0252127 A1* | 11/2007 | Arnold et al. | 257/2 |
| 2008/0042117 A1* | 2/2008 | Hsu | 257/3 |
| 2008/0042243 A1* | 2/2008 | Lee et al. | 257/613 |
| 2008/0048293 A1* | 2/2008 | Horii | 257/536 |
| 2008/0173858 A1* | 7/2008 | An et al. | 257/3 |
| 2008/0197335 A1* | 8/2008 | Yu | 257/4 |
| 2008/0237562 A1* | 10/2008 | Chen et al. | 257/3 |
| 2008/0265238 A1* | 10/2008 | Chen et al. | 257/3 |
| 2008/0272355 A1* | 11/2008 | Cho et al. | 257/2 |
| 2008/0290335 A1* | 11/2008 | Lin et al. | 257/4 |
| 2008/0308785 A1* | 12/2008 | Park et al. | 257/4 |
| 2009/0014705 A1* | 1/2009 | Hsu et al. | 257/3 |
| 2009/0020739 A1* | 1/2009 | Arnold et al. | 257/2 |
| 2009/0098678 A1* | 4/2009 | Lung | 438/54 |
| 2009/0101883 A1* | 4/2009 | Lai et al. | 257/3 |
| 2009/0111228 A1* | 4/2009 | Breitwisch et al. | 438/261 |
| 2010/0140583 A1* | 6/2010 | Chen et al. | 257/4 |

* cited by examiner

PHASE CHANGE MEMORY DEVICE AND FABRICATING METHOD THEREFOR

CROSS-REFERENCE TO RELATED APPLICATIONS

This application is a divisional application of and claims benefit of U.S. patent application Ser. No. 11/479,497, filed Jun. 30, 2006, entitled "Phase Change Memory Device and Fabricating Method Therefor," by Wei-Su Chen et al., now U.S. Pat. No. 7,598,113, the disclosure of which is hereby incorporated herein in its entirety by reference. U.S. patent application Ser. No. 11/479,497 itself claims priority under 35 U.S.C. §119(a) on patent Application No. 094146978 filed in Taiwan, R.O.C. on Dec. 28, 2005, the entire contents of which are hereby incorporated by reference.

BACKGROUND OF THE INVENTION

1. Field of Invention

The present invention relates to a nonvolatile memory device, and more particularly, to a phase change memory device and a fabricating method therefor.

2. Related Art

A phase change memory (PCM) is a nonvolatile memory device. The resistance value of the device can be transformed by changing a crystalline phase of the phase change material through a heating effect.

At present, a chalcogenide phase change material is widely applied in forming the memory cell of the PCM. The chalcogenide is a substance with various solid-state phases, and can be a thereto-induced transition along with a temperature variation. The chalcogenide has a high resistance value when in an anisotropic state (with an irregular atomic arrangement), while has a low resistance value when in a crystalline state (with a regular atomic arrangement). Herein, temperature variations are achieved by providing current or optical pulses, or by another method.

Generally speaking, in a PCM, a transistor is used as a select device to control the current passing through the PCM device and the voltage applied to the chalcogenide. Therefore, in order to reduce the size and power consumption of the PCM, the operation current for the PCM device must be reduced. The current heating effect of the resistance value in the interface region is a function of the contact area of the interface region. Therefore, in the prior art, reducing the operation current may be achieved by reducing the area of the interface region between the current path and the phase change material.

Conventionally, the PCM device is of a T-shape structure, wherein a current path through a phase change layer 130 is formed between the upper and lower electrodes 120, 110, as shown in FIG. 1. A small hole is formed on the dielectric layer 140 through a lithographic process, and then filled with a metal material to form the lower electrode 110, such that the contact area between the lower electrode 110 and the phase change layer 130 is reduced. The contact area between the phase change material (i.e. the phase change layer) and the lower electrode for heating is limited by the capability of the lithographic process. Besides, the small hole is filled with a metal material, easily causing a problem of inadequate step coverage. Moreover, in practice, it is not easy to update the capability of the lithographic process, because equipment must be renewed and personnel must be trained, consuming a great deal of labor and costs.

Therefore, a tapered design is proposed, in which a tip of the tapered lower electrode contacts the phase change layer, thereby reducing the contact area between the two.

Referring to FIG. 2, multiple conductive substrates 111a, 111b, 111c, 111d and a heating electrode 112 are etched in sync to form the tapered structure under an isotropic etching principle. The tapered heating electrode 112 contacts the phase change layer 130, thereby reducing the contact area, as shown in U.S. Pat. No. 6,800,563. However, in practical fabrication with this method, several different materials must he taken into consideration simultaneously when the etching is carried out. Therefore, poor uniformity or undesired etch-pattern problem may occur.

Therefore, an edge contact PCM device has been developed, as shown in FIG. 3. The heating electrode 112 is disposed in the interlayer between the trench sidewalls. The size of the contact area with the phase change layer 130 is controlled by the thickness of the heating electrode 112. However, this may result in difficulty in filling the hole for the phase change material, thus leading to a poor contact of the lateral contact interface and causing a problem in the uniformity and reliability of the device. In addition, the heating electrode extends transversally to contact the phase change material, such that the current path of the heating electrode is increasing. Also, the resistance is high, which causes extra power consumption.

Furthermore, another possible PCM device is a lateral device, as shown in U.S. Pat. No. 6,867,425. Referring to FIG. 4, similarly, the electrodes 114, 122 are disposed in the interlayer between the trench sidewalls, and the size of the contact area with the phase change layer 130 is controlled by the thickness of the electrodes 114, 122. Though the operation current is reduced by the lateral contact, and the path of the current flowing through the phase change material is shortened by controlling the distance between the two electrodes, thereby reducing the power consumption when operating the device, the material of an ordinary heating electrode is usually of a high resistance, and when it serves as a lead, it causes an increase in parasitic resistance, and further causes extra power consumption. Furthermore, when the distance between the two electrodes is relatively small, operational power consumption is reduced, but problems of difficulty, uniformity, and reliability for the phase change material in filling the hole and contacting the sidewall arise.

However, in practice, the restrain of the heat produced by the current also affects desirable reproducibility of the PCM device (i.e., insensitivity to etching damage), resistance aggregation, and low operation current. In a conventional PCM device, when a current is applied to perform Joule heating of the phase change layer, the current and the produced heat are often made to flow and dissipate in a three-dimensional phase change material, so the capability for restraining the heat is rather limited. Also, three-dimensional phase change material is complicated in device characteristic simulation, and it is difficult to achieve accurate simulation and easy authentication.

Also, in the prior arts, in order to reduce the area of interface region between the current path and the phase change material, multiple metal laminations are used. This structure is complicated and is difficult to etch, such that the whole process becomes rather complicated.

Furthermore, in the conventional PCM devices, as the area of the phase change material exposed by the photoresist is excessively large when etching the phase change layer, it leads to a loading effect, thereby producing metal-based polymer residuals at the etched edge of the phase change material. When the heat produced by the current is transmitted to the etched edge of the phase change material, it may cause diffusion, expansion, melting, or reaction of the metal polymer, thereby damaging the device structure.

Similarly, in the conventional PCM device, the heating electrode is mainly fabricated by etching. Therefore, when the area of the heating electrode exposed by the photoresist is excessively large, metal-based polymer residuals are produced on the etched edge. When the heat produced by the current is transmitted to the etched edge, it may lead to diffusion, expansion, or reaction of the metal-based polymer, thereby damaging the device structure.

Therefore, it is an important development direction for those skilled in the art to provide a PCM device with a low operation current, high reproducibility, and simple process and memory cell structure.

SUMMARY OF THE INVENTION

In view of above problems, an object of the present invention is to provide a phase change memory (PCM) device and a fabricating method therefor, thus solving the problems of the prior art.

According to one aspect of the invention, the PCM device is provided by the present invention includes a first electrode, a first insulating layer, a phase change layer, a second insulating layer, a center via, a heating electrode, a third insulating layer, a ring via, and a second electrode. The first electrode, the first insulating layer, the phase change layer, and the second insulating layer are stacked respectively. The phase change layer and the second insulating layer assume a disk shape. The center via substantially corresponds to the center of the disk and passes through the first insulating layer, the phase change layer, and the second insulating layer to reach the interface of the first electrode. The heating electrode is disposed within the center via. The third insulating layer is located on the first and second insulating layers, and covers the first insulating layer, the second electrode, and the second insulating layer. The ring via passes through the third and second insulating layers, and the diameter of the periphery of the ring via is substantially the same as the diameter of the disk shape, that is, the periphery of the ring via substantially overlaps the edge of the phase change layer. The second electrode is disposed within the ring via, and assumes a ring shape. Therefore, the phase change layer assumes a two-dimensional hollow disk shape.

According to another aspect of the invention, a method for fabricating the PCM device is provided. The method includes the following steps. A first electrode is provided. A first insulating layer, a phase change layer, and a second insulating layer are formed in order on the first electrode. Then, a ring via passing through the second insulating layer and a center via passing through the second insulating layer, the phase change layer, and the first insulating layer are formed. Next, a second electrode and a heating electrode are formed within the ring via and the center via respectively. The second insulating layer and the phase change layer corresponding to the region outside the periphery of the ring-shaped second electrode are etched until the first insulating layer is exposed, such that the phase change layer assumes a disk shape. Then, a third insulating layer is formed on the first and second insulating layers to cover the first insulating layer, the second electrode, and the second insulating layer. Finally, the third insulating layer is etched corresponding to the second electrode, until the second electrode is exposed.

Accordingly, the PCM device of the present invention has the following advantages:

(a). It has a preferred heat restraining effect.

(b). It can avoid a resistance variation and reduction due to the variation of the contact area.

(c). No metal-based polymer is expected to remain in the region within the center via after the etching.

(d). The heat produced by the phase change is dissipated by the ring-shaped enclosure second electrode, and is not transmitted to the metal-based polymer on the edge of the phase change layer to burn out the device or cause damage.

(e). It is possible to change the phase of the entire phase change layer, which is difficult to be achieved by the three-dimensional device structure of the ordinary conventional art.

(f). It is easier and faster in device simulation to make theoretical calculations before the fabrication process than it is for the device structure of the conventional art.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Figure 1:
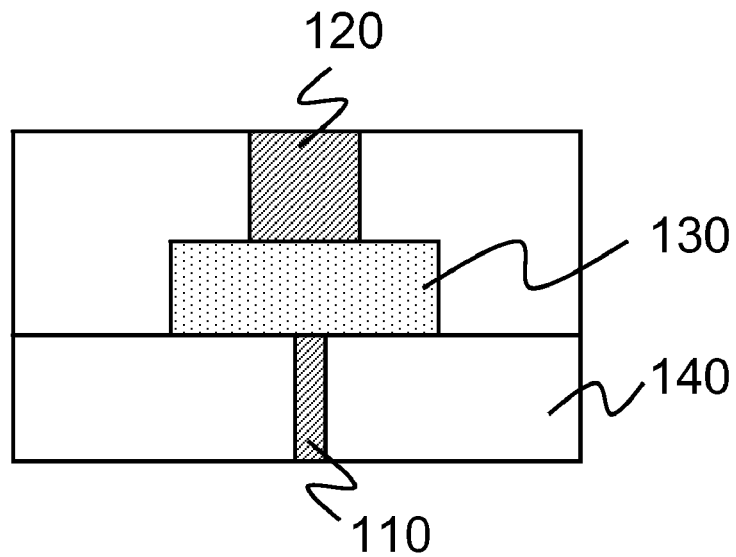
FIG. 1 is a sectional view of a conventional PCM cell.
Figure 2:
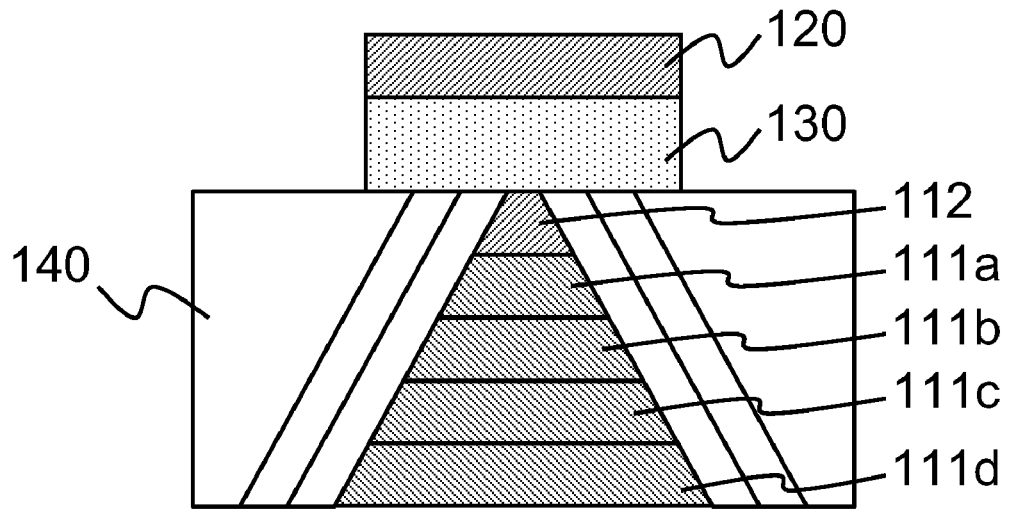
FIG. 2 is a sectional view of another conventional PCM cell.
Figure 3:
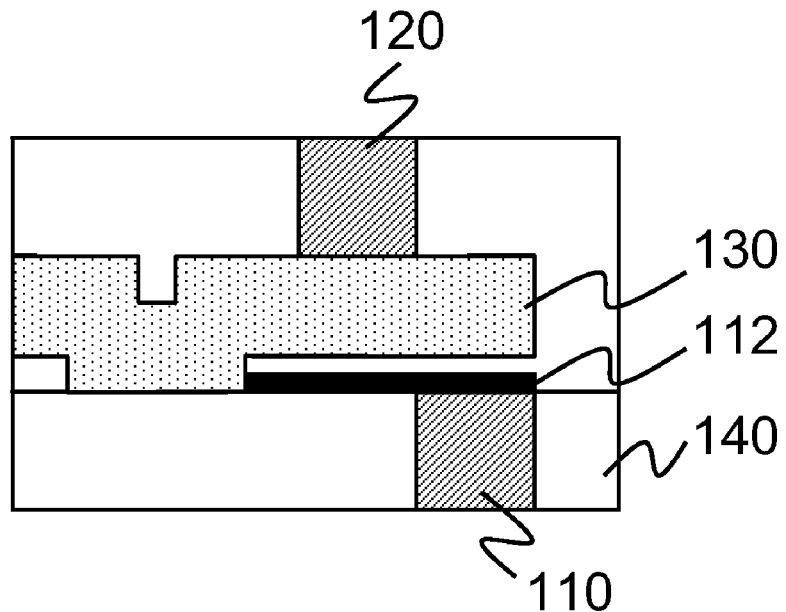
FIG. 3 is a sectional view of still another conventional PCM cell.
Figure 4:
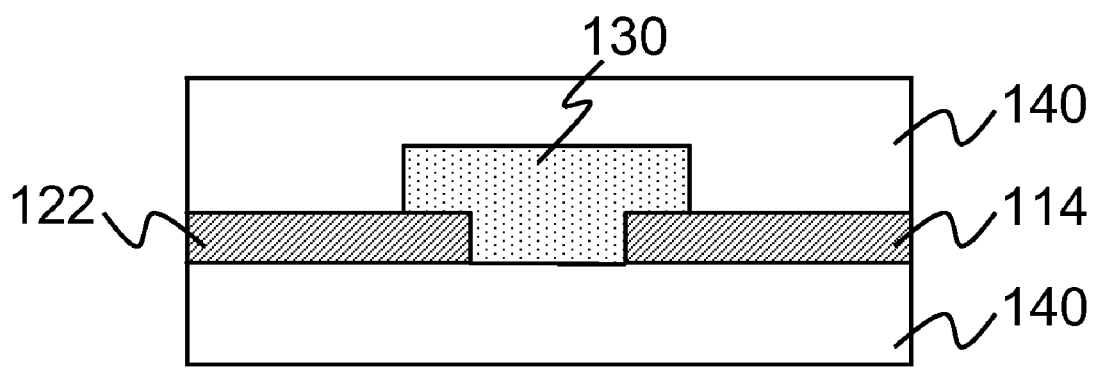
FIG. 4 is a sectional view of yet another conventional PCM cell.

The content of the present invention is illustrated below in detail through the embodiments with reference to the accompanied drawings. The reference numerals mentioned in the illustration refer to the corresponding numerals in the drawings.

Figure 5A:
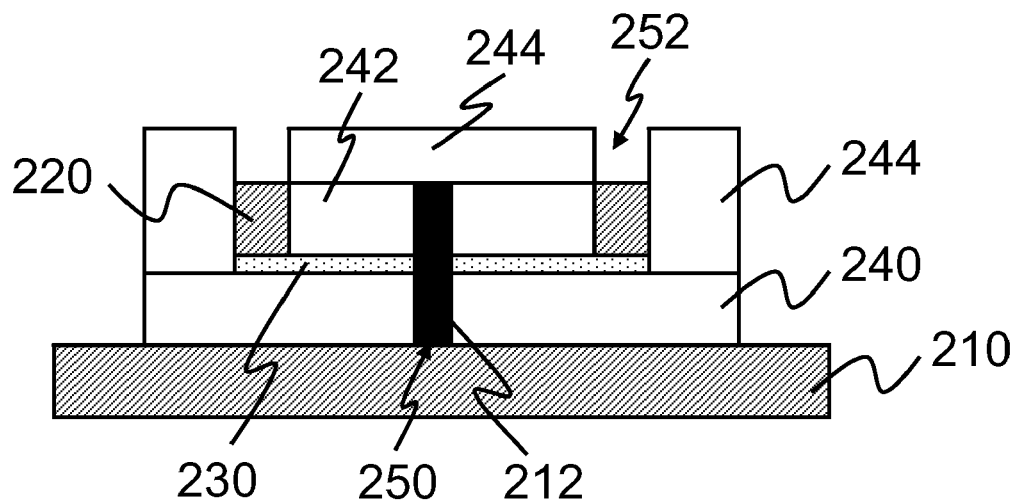
FIG. 5A is a sectional view of a PCM device according to the first embodiment of the present invention.
Figure 5B:
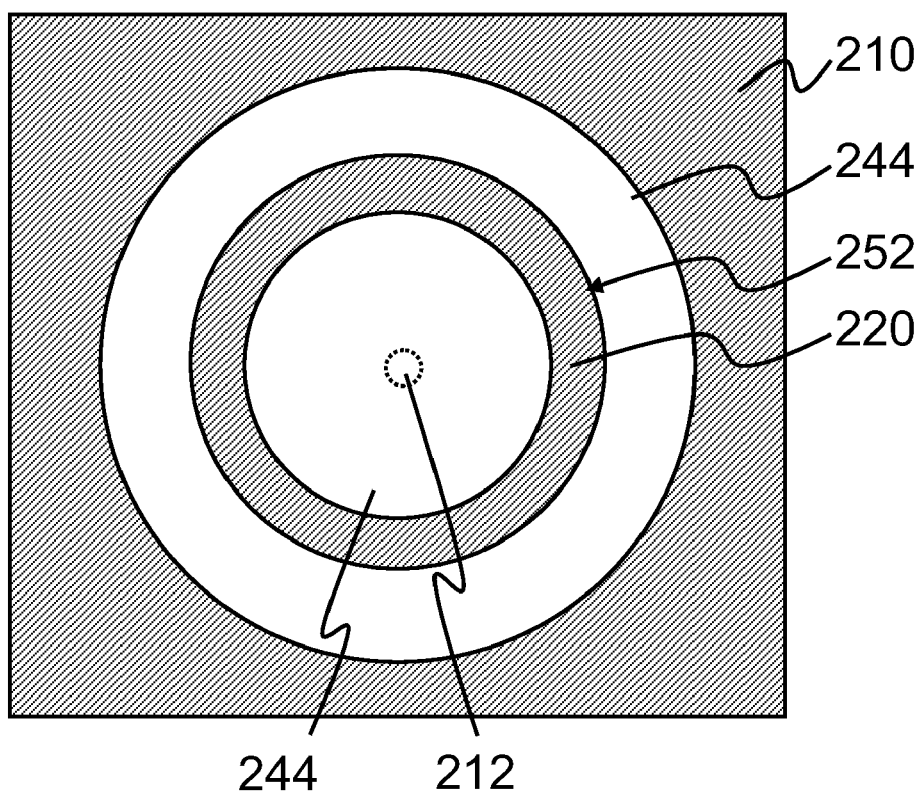
FIG. 5B is a top view of the PCM device according to the first embodiment of the present invention.

Referring to FIGS. 5A and 5B, a PCM device according to an embodiment of the present invention is shown. The PCM device assumes a two-dimensional disk shape and includes a first electrode 210, a first insulating layer 240, a phase change layer 230, a second insulating layer 242, a center via 250, a heating electrode 212, a third insulating layer 244, a ring via 252, and a second electrode 220. The first electrode 210, the first insulating layer 240, the phase change layer 230, and the second insulating layer 242 are stacked in order. The phase change layer 230 and the second insulating layer 242 assume a disk shape. The center via 250 is substantially located at the center of the disk, and passes through the first insulating layer 240, the phase change layer 230, and the second insulating layer 242 to reach the interface of the first electrode 210. The heating electrode 212 is disposed within the center via 250. The third insulating layer 244 is located on the first insulating layer 240 and the second insulating layer 242, and covers the first insulating layer 240, the second electrode 220, and the second insulating layer 242. The ring via 252 passes through the third insulating layer 244 and the second insulating layer 242, and the diameter of the periphery of the ring via 252 is substantially the same as the diameter of the disk, i.e., the periphery of the ring via 252 substantially overlaps the edge of the phase change layer 230. The second electrode 220 is disposed within the ring via 252, and assumes a ring shape.

The phase change layer 230 is shaped like a two-dimensional hollow disk. The thickness of the phase change layer 230 is between 1 nm (nanometer) to 300 nm. The phase change layer 230 is a single phase change material film. The main material of the phase change layer is a chalcogenide, such as GeSbTe alloy, GeSbSnTe alloy, IrGeSbTe alloy, or another phase change material.

When a current is applied to the PCM device, a Joule heating is performed to the phase change layer 230 through the heating electrode 212, and the ring-shaped contact interface between the ring-shaped second electrode 220 and the phase change layer 230 enables the heat at the inner side of the ring-shaped contact interface to be dissipated through the second electrode 220. In other words, the second electrode 220 is used as a heat sink for the phase change layer 230, such that the heat is not diffused to the etching boundary at the periphery of the phase change layer 230, thereby avoiding defects in etching the phase change material of the periphery, and further avoiding the heat effect to the device caused by the remained metal-based polymer.

Furthermore, as the first insulating layer 240, the phase change layer 230, and the second insulating layer 242 are formed into a sandwich interlayer structure, the phase change layer 230 assumes a two-dimensional plane completely, such that the first insulating layer 240 and the second insulating layer 242 can efficiently restrain the heat within the phase change layer 230. In short, the sandwich interlayer structure formed by the first insulating layer 240, the phase change layer 230, and the second insulating layer 242 is a heat insulating structure, and has a preferred heat restraining effect, thereby reducing the operation current. In addition, the thickness of each insulating layer (i.e., the first insulating layer 240, the second insulating layer 242, and the third insulating layer 244) is between 10 nm and 5000 nm. Also, each insulating layer is made of the same or different materials, such as Low-temp Nitride (LTN) layers, Low-temp Oxide (LTO) dielectric insulating layers, Low-K Dielectric materials (e.g., methyl-silsesquioxane (MSQ), hydrogen silsesquioxane (HSQ)), and High-K Dielectric materials (e.g., $Ta_2O_5$, $HfO_2$, and $IrO_2$).

Moreover, the center via 250 is formed by an optical or another lithography technique, such as electron beam direct writing lithography, advanced ArF lithography, ArF immersion lithography, or deep UV (DUV) lithography. Furthermore, the ring via 252 is also formed by an optical or another lithography technique, such as electron beam direct writing lithography, advanced ArF lithography, ArF immersion lithography, or DUV lithography.

Furthermore, the heating electrode 212 within the center via 250 for connecting the first electrode 210 is a rodlike metal, that is, the rodlike metal passes through the phase change layer 230 shaped like a two-dimensional hollow disk to contact the phase change layer 230, thereby performing Joule heating of the phase change layer 230. The material of the heating electrode is a conductive material, such as Ti, Ta, TiN, TaN, TiAlNx, TiCNx, TaW, TiW, TaO, poly-Si, TaSiO, C, SiC, GeN, or another metal that may be filled into a hole with a diameter of less than 50 nm. The diameter of the heating electrode is between 1 nm and 5000 nm.

The phase change layer 230 may contact the rodlike heating electrode 212 at any position from the bottom to the top of the rodlike heating electrode 212. However, it has to retain a thickness at its both sides respectively for the first insulating layer 240 and the second insulating layer 242. Therefore, the thickness of the first insulating layer 240 and the second insulating layer 242 may determine the position of the phase change layer 230 contacting the rodlike heating electrode 212, The material of the first electrode 210 and the second electrode 220 is a conductive material with desirable conductivity, such as Al, W, Mo, Ti, or Cu.

Figure 6:
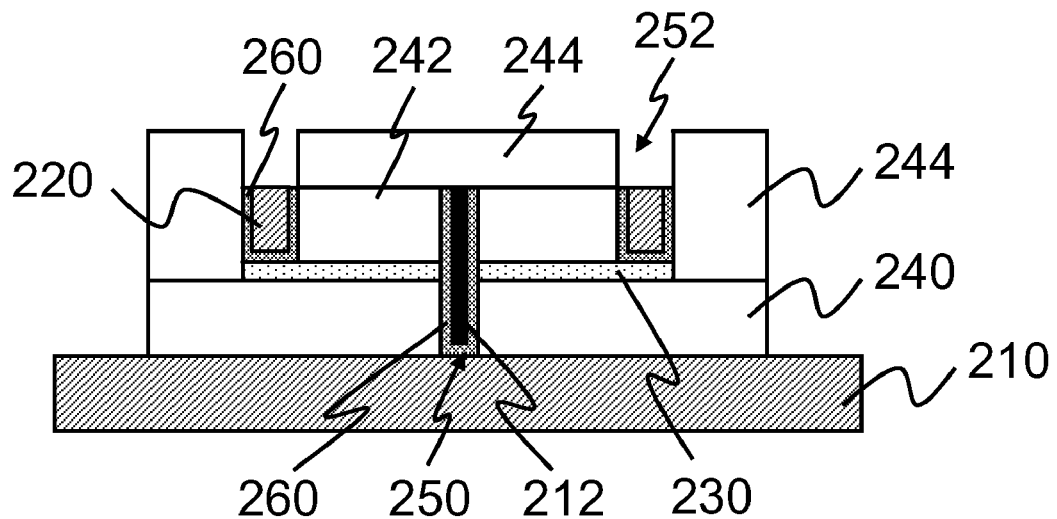
FIG. 6 is a sectional view of a PCM device according to the second embodiment of the present invention.

Furthermore, a diffusion barrier layer 260 is formed between the phase change layer 230 and the heating electrode 212 and between the phase change layer 230 and the second electrode 220 respectively, so as to prevent the metal materials from diffusing there-between, as shown in FIG. 6. The material of the diffusion barrier layer 260 is a material with a desirable thermal stability, such as TiN, TaN, TiSiN, TaSiN, or TiW.

The PCM device according to the present invention is formed by the following process.

Figure 7A:
FIGS. 7A to 7G are flow charts of a method of fabricating a PCM device according to the first embodiment of the present invention.

First, a first electrode 210 is provided, as shown in FIG. 7A.

Figure 7B:
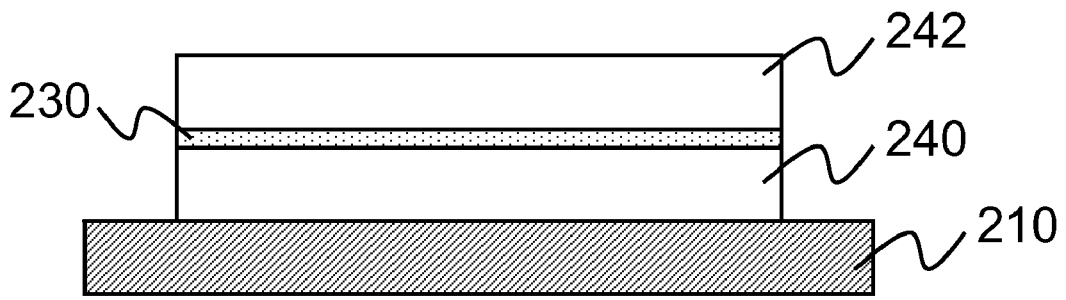

Next, a first insulating layer 240, a phase change layer 230, and a second insulating layer 242 are formed in order on the first electrode 210, as shown in FIG. 7B.

Figure 7C:
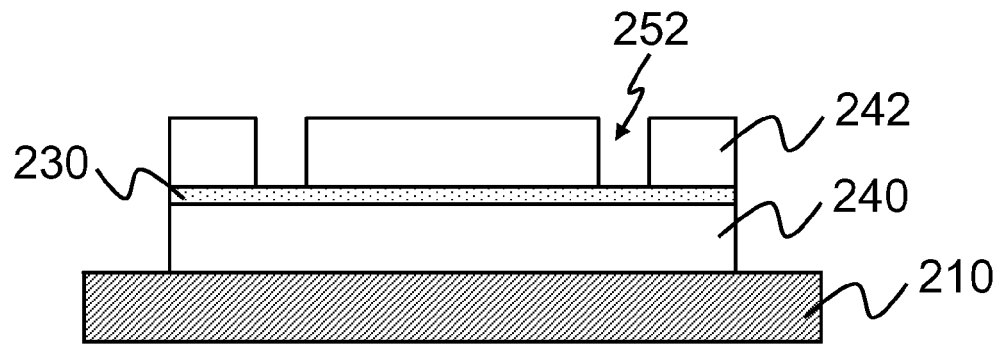
Figure 8:
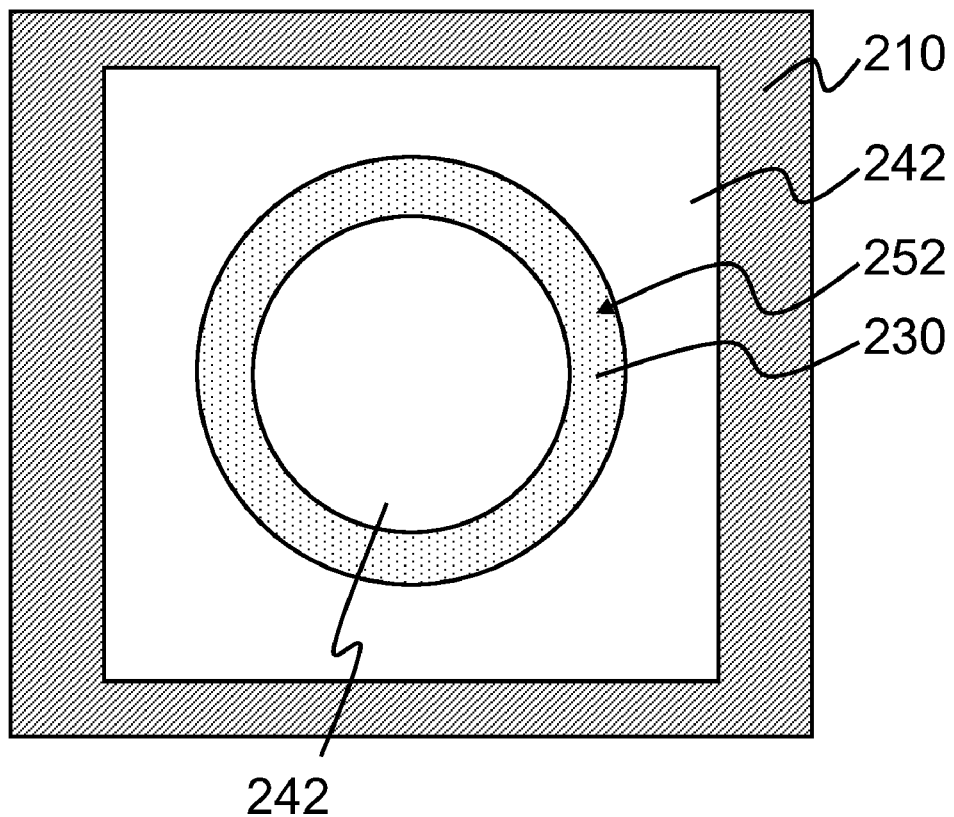
FIG. 8 is a top view of the structure as shown in FIG. 7C.
Figure 9A:
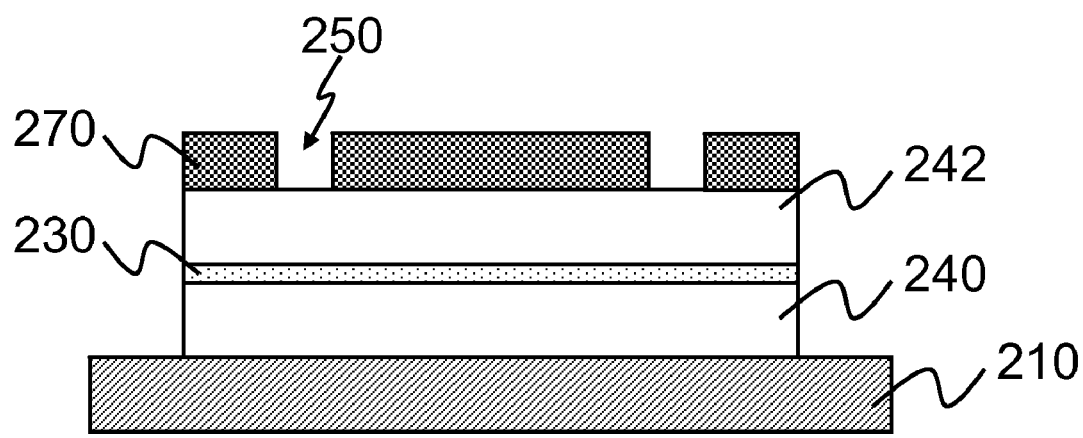
FIGS. 9A and 9B are detailed flow charts of an embodiment of forming the structure as shown in FIG. 7C.
Figure 9B:
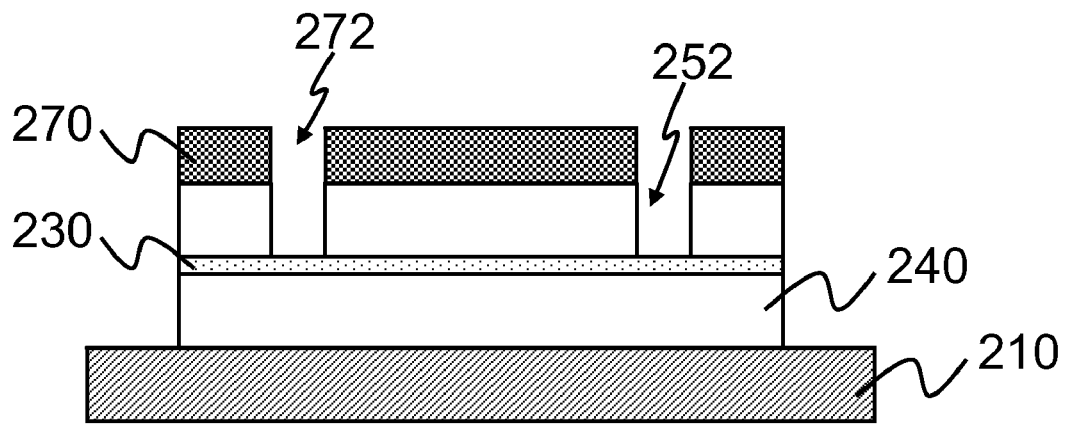

Then, the second insulating layer 242 is etched until the phase change layer 230 is exposed, so as to form a ring via 252 passing through the second insulating layer 242, as shown in FIGS. 7C and 8. Herein, a photoresist pattern 270 with a ring hole 272 is formed on the second insulating layer 242 first, as shown in FIG. 9A. Then, the second insulating layer 242 is etched through the ring hole 272 with a photoresist pattern 270 as an etching mask until the corresponding interface of the phase change layer 230 is exposed, so as to form the ring via 252 passing through the second insulating layer 242, as shown in FIG. 9B. Finally, the photoresist pattern 270 is removed, thus obtaining a structure as shown in FIGS. 7C and 8.

Figure 7D:
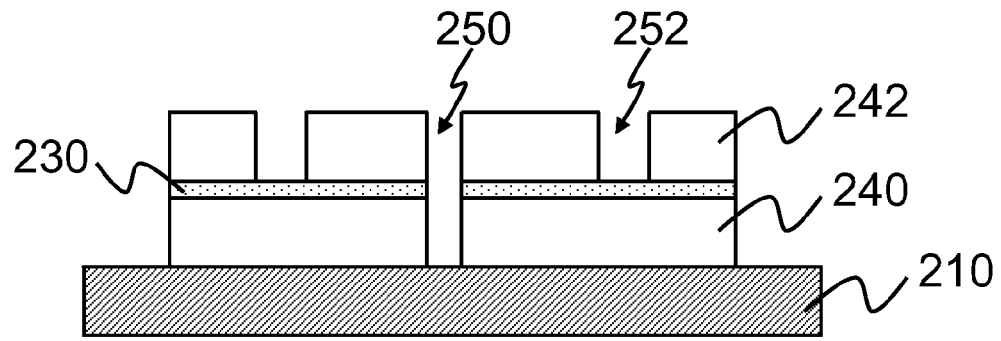
Figure 10:
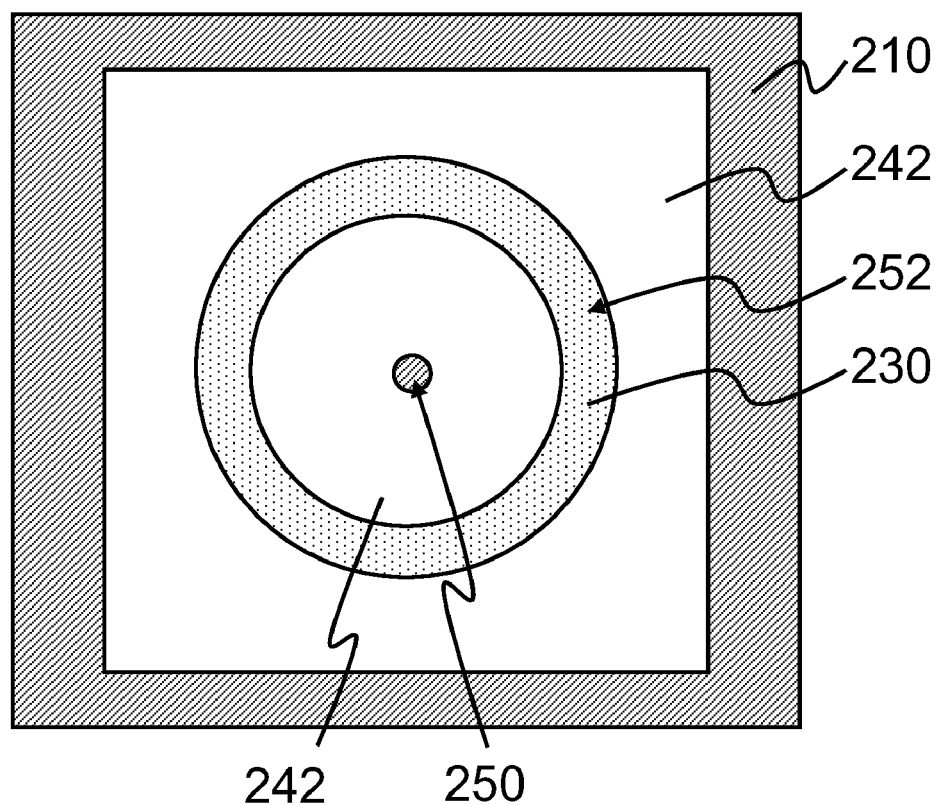
FIG. 10 is a top view of the structure as shown in FIG. 7D.
Figure 11A:
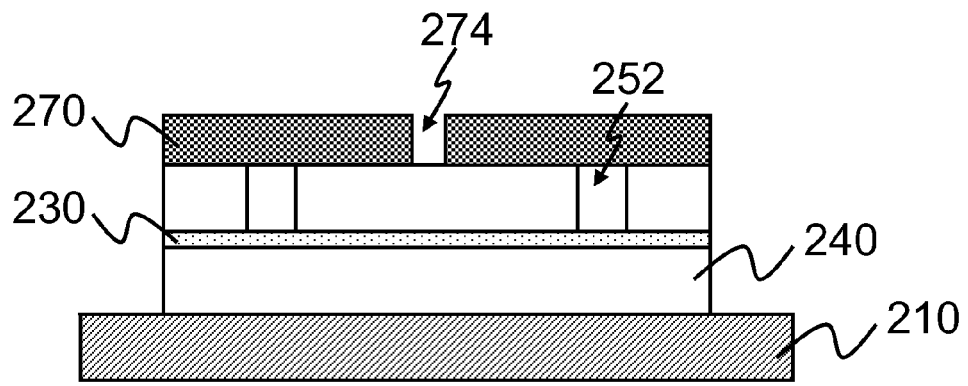
FIGS. 11A and 11B are detailed flow charts of an embodiment of forming the structure as shown in FIG. 7D.
Figure 11B:
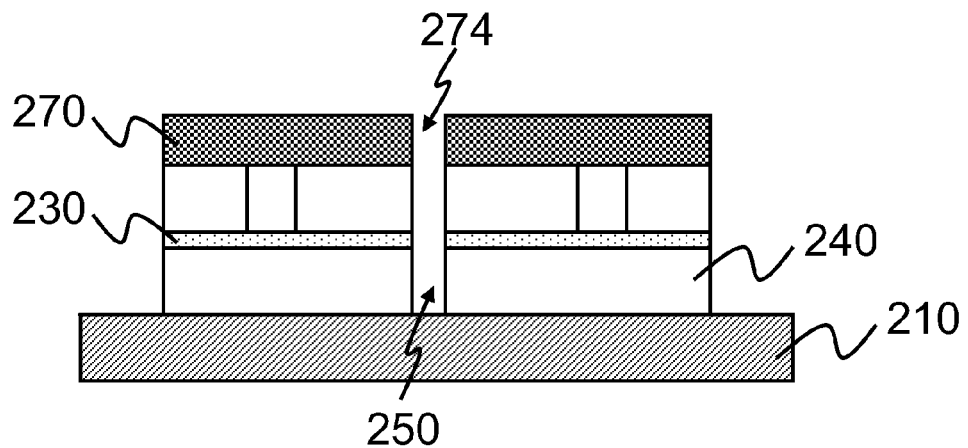

Then, the second insulating layer 242, the phase change layer 230, and the first insulating layer 240 are etched until the first electrode 210 is exposed, so as to form a center via 250. The center via 250 is substantially located at the center of the ring via 252, and passes through the second insulating layer 242, the phase change layer 230, and the first insulating layer 240, as shown in FIGS. 7D and 10. Also, a photoresist pattern 270 with a center hole 274 is formed on the second insulating layer 242, and the center hole 274 corresponds to the center of the ring via 252, as shown in FIG. 11A. Then, the second insulating layer 242, the phase change layer 230, and the first insulating layer 240 are etched through the center hole 274 with the photoresist pattern 270 as an etching mask until the corresponding interface of the first electrode 210 is exposed, so as to form a ring via 252 passing through the second insulating layer 242, the phase change layer 230, and the first insulating layer 240, as shown in FIG. 11B. Finally, the photoresist pattern 270 is removed, thus obtaining a structure as shown in FIGS. 7D and 10. In such a way, the phase change layer is shaped like a two-dimensional hollow disk. The thickness of the phase change layer is controlled through the thickness of the coating film. The thickness of the phase change layer here is between 1 nm and 300 nm.

Figure 7E:
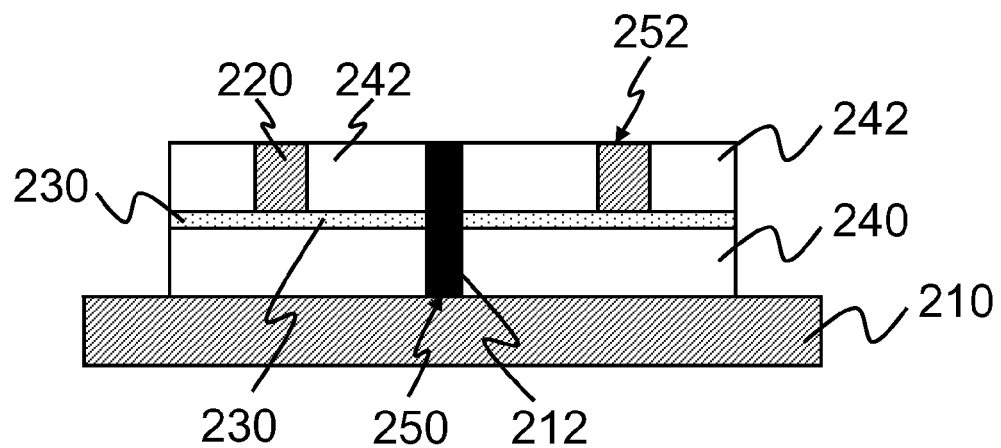

Then, a second electrode 220 is formed within the ring via 252, and a heating electrode 212 is formed within the center via 250, wherein the second electrode 220 assumes a ring shape, as shown in FIG. 7E. The planarization of the second insulating layer is achieved by a Chemical Mechanical Polishing (CMP) or Etch back technique. The heating electrode 212 is a rodlike metal, such that the rodlike metal passes through the phase change layer shaped like a two-dimensional hollow disk to contact the phase change layer, thereby performing Joule heating of the phase change layer. The diameter of the heating electrode is between 1 nm and 5000 nm.

Figure 7F:
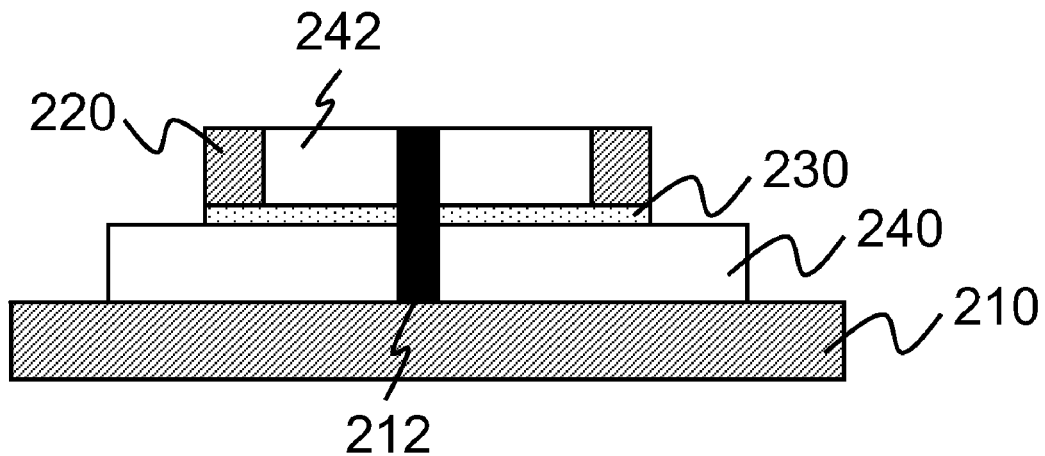
Figure 12A:
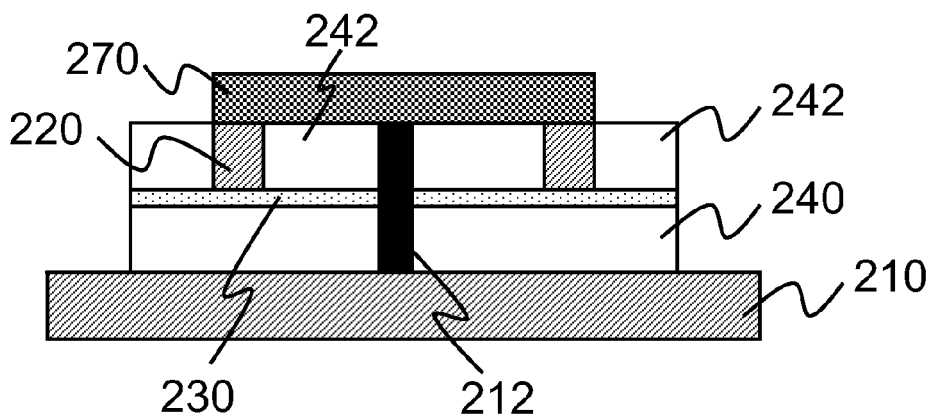
FIGS. 12A and 12B are detailed flow charts of an embodiment of forming the structure as shown in FIG. 7F.
Figure 12B:
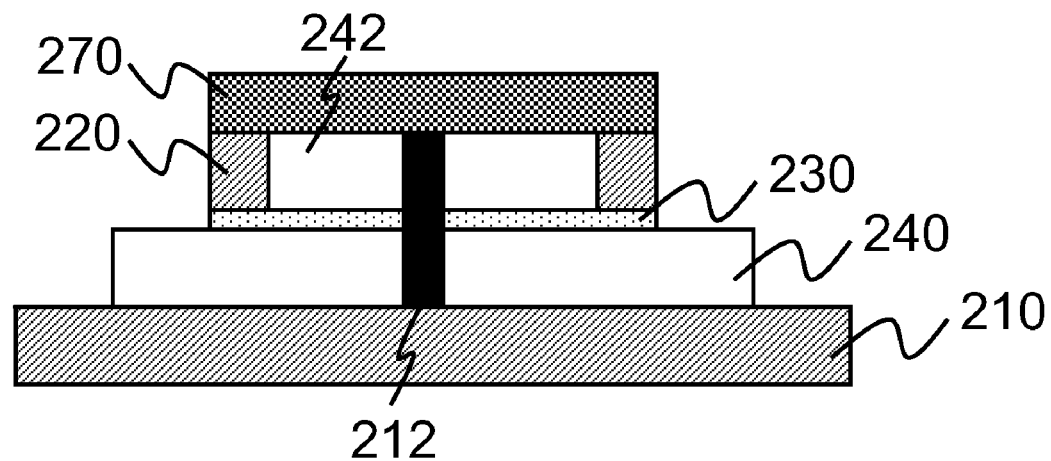

Subsequently, the second insulating layer 242 and the phase change layer 230 corresponding to the region outside the ring-shaped periphery of the second electrode 220 are etched until the first insulating layer 240 is exposed, as shown in FIG. 7F. In other words, the undesired phase change layer 230, i.e., the part outside the ring-shaped periphery of the second electrode 220, is removed by an etching technique. After the etching, the phase change layer 230 assumes a disk shape. Herein, a disk-shaped photoresist pattern 270 is formed on the second insulating layer 242, and the diameter of the disk shape is substantially the same as the diameter of the ring-shaped periphery of the second electrode 220, that is, the periphery of the disk shape substantially overlaps the ring-shaped periphery of the second electrode 220, as shown in FIG. 12A. Then, the second insulating layer 242 and the phase change layer 230 in the region outside the photoresist pattern 270 are etched with the disk-shaped photoresist pattern 270 as an etching mask until the corresponding interface of the first insulating layer 240 is exposed, as shown FIG. 12B. Finally, the photoresist pattern 270 is removed, thus obtaining a structure as shown in FIG. 7F.

Figure 7G:
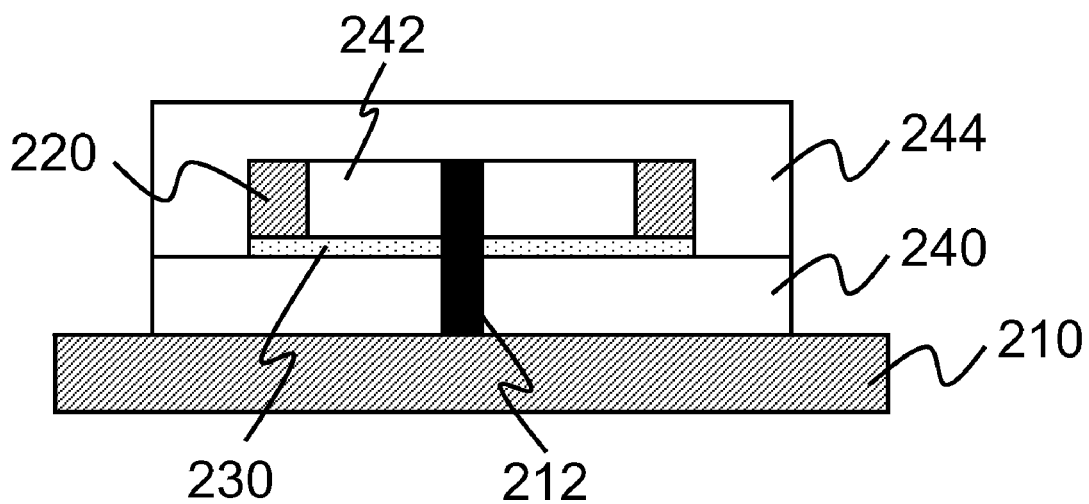

Then, a third insulating layer 244 is formed on the first insulating layer 240 and the second insulating layer 242, so as to cover the first insulating layer 240, the second electrode 220, and the second insulating layer 242, as shown in FIG. 7G. The third insulating layer 244 is coated up to a sufficient thickness (i.e., the surface seems to be flat enough) first, and then planarized by a Chemical Mechanical Polishing (CMP) or Etch back technique. Herein, after the planarization, if the thickness of the third insulating layer 244 is not sufficient, the third insulating layer 244 is compensatively coated, such that a required insulation thickness is achieved.

Figure 13A:
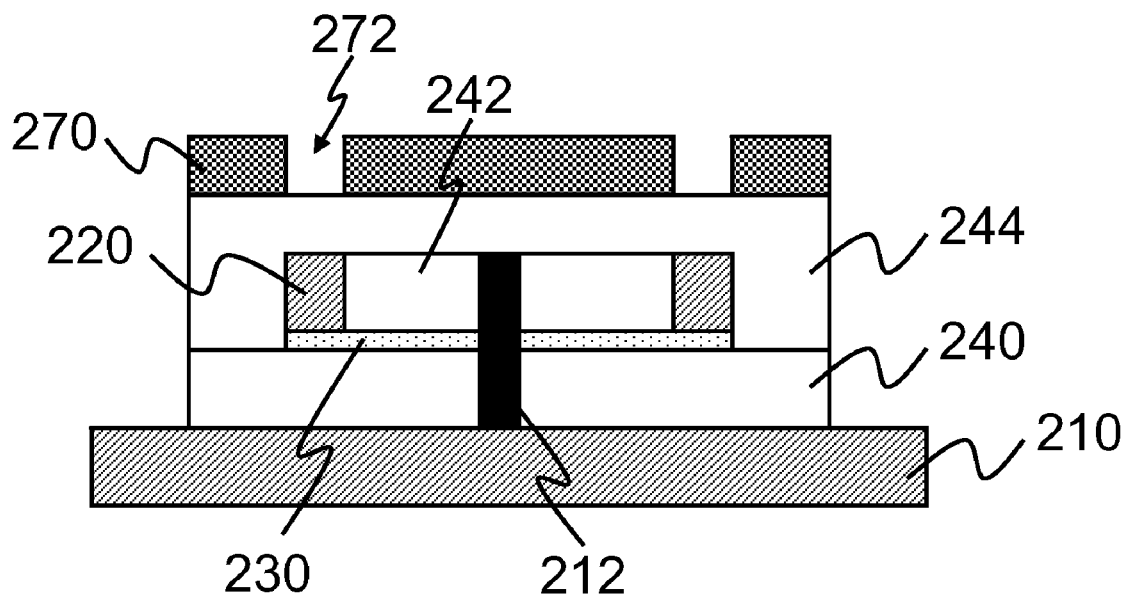
FIGS. 13A and 13B are detailed flow charts of an embodiment of forming the structure as shown in FIG. 5A.
Figure 13B:
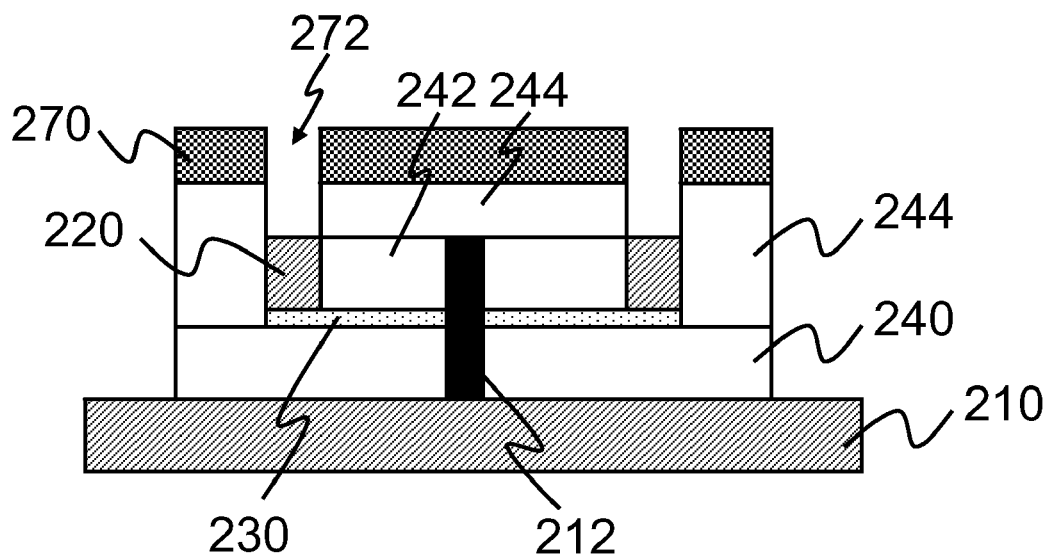

Finally, the third insulating layer 244 is etched corresponding to the second electrode 220 until the second electrode 220 is exposed. In other words, the third insulating layer 244 on the second electrode 220 is removed to expose the second electrode 220, such that the device shown in FIGS. 5A and 5B is obtained. Herein, a photoresist pattern 270 with a ring hole 272 is formed on the third insulating layer 244 first, and the inner and outer diameters of the ring hole 272 are substantially the same as that of the second electrode 220, as shown in FIG. 13A. Then, the third insulating layer 244 is etched through the ring hole 272 with the photoresist pattern 270 as an etching mask until the corresponding interface of the second electrode 220 is exposed, so as to expose the second electrode 220, as shown in FIG. 13B. Finally, the photoresist pattern 270 is removed, thus obtaining the structure shown in FIGS. 5A and 5B. In practice, the photoresist pattern is defined by the mask for etching the ring via mentioned above.

Moreover, in each etching step, the photoresist pattern is defined by an optical or another lithography process, such as electron beam direct writing lithography, advanced ArF lithography, ArF immersion lithography, or DUV lithography, to conduct the etching process.

Figure 14A:
FIGS. 14A to 14G are flow charts of a method of fabricating a PCM device according to the second embodiment of the present invention.
Figure 14B:
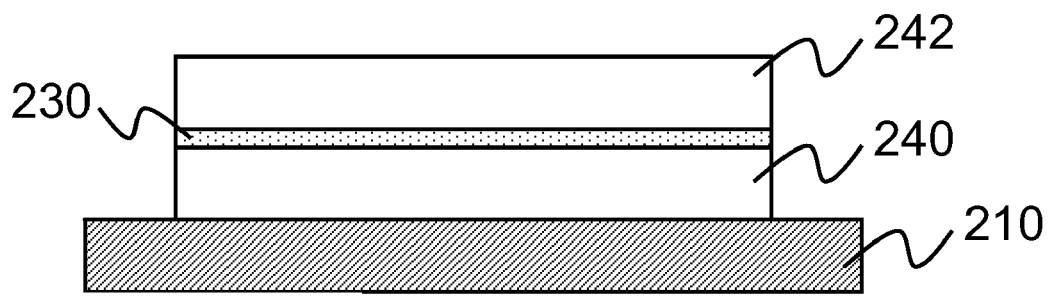
Figure 14C:
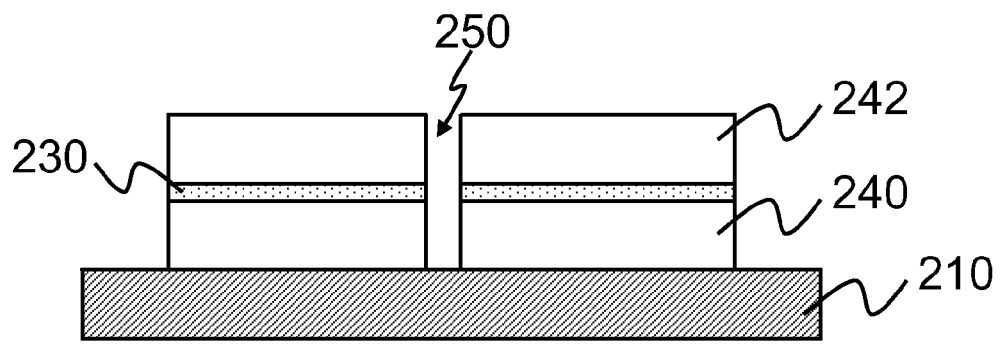
Figure 14D:
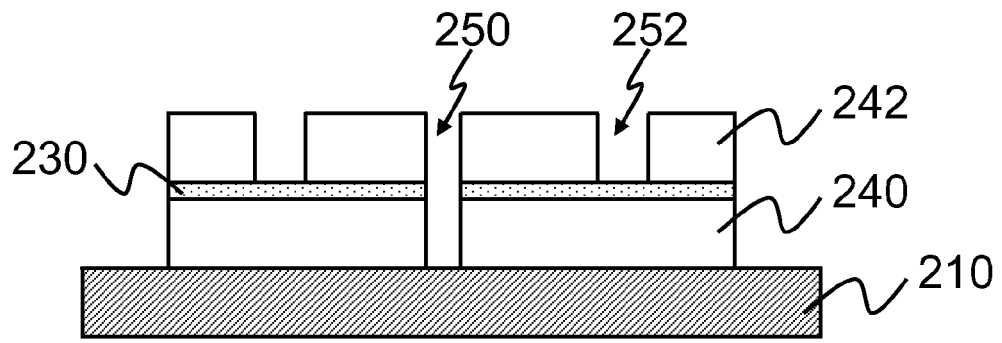
Figure 14E:
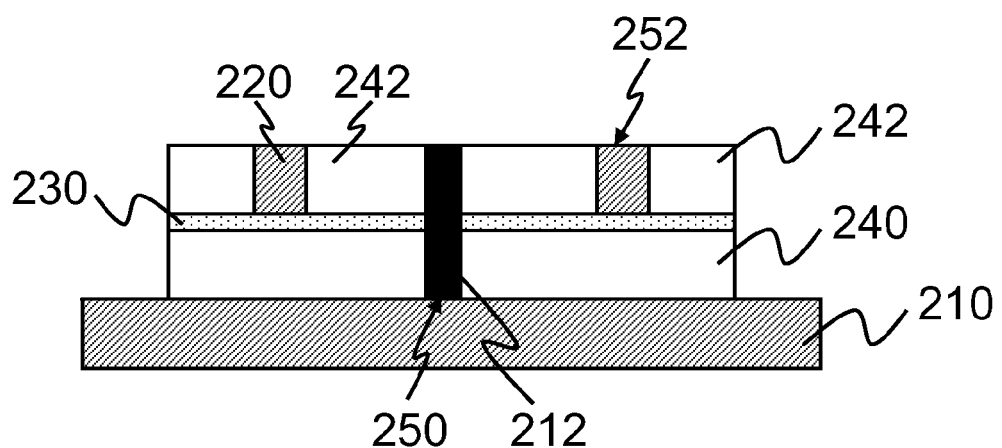
Figure 14F:
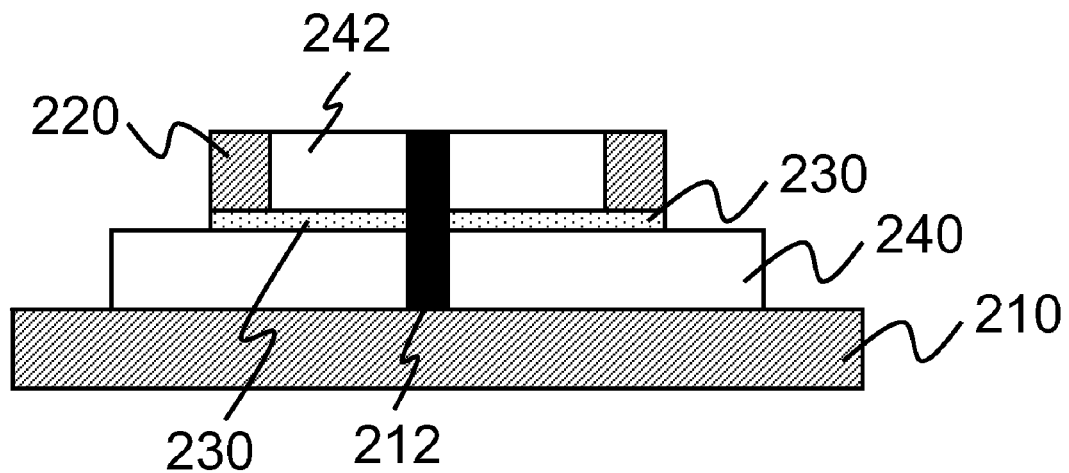
Figure 14G:
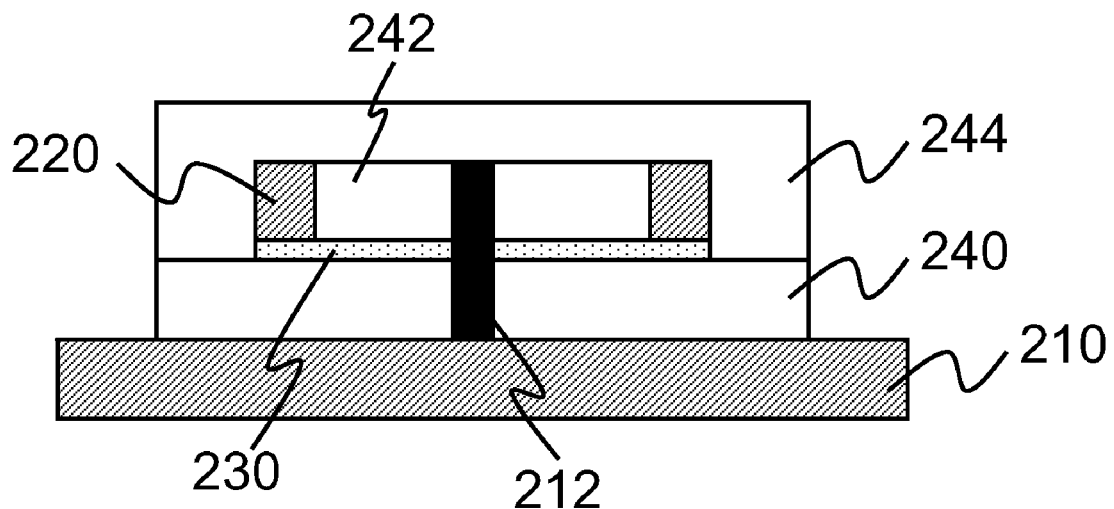

Additionally, referring to FIGS. 14A to 14G, after the first insulating layer 240, the phase change layer 230, and the second insulating layer 242 are formed respectively (shown in FIG. 14B), the second insulating layer 242, the phase change layer 230, and the first insulating layer 240 are firstly etched until the first electrode 210 is exposed, so as to form a center via 250 passing through the second insulating layer 242, the phase change layer 230, and the first insulating layer 240, as shown in FIG. 14C. Then, the second insulating layer 242 is etched until the phase change layer 230 is exposed, so as to form a ring via 252 passing through the second insulating layer 242 and substantially taking the center via 250 as the center, shown in FIG. 14D. Finally, the third insulating layer 244 corresponding to the second electrode 220 in the structure shown in FIG. 14G is etched away to expose the second electrode 220, such that the device shown in FIGS. 5A and 5B is obtained. In other words, the third insulating layer 244 on the second electrode 220 in the structure shown in FIG. 14G is removed, so as to expose the second electrode 220.

Figure 15A:
FIGS. 15A to 15G are flow charts of a method of fabricating a PCM device according to the third embodiment of the present invention.
Figure 15B:
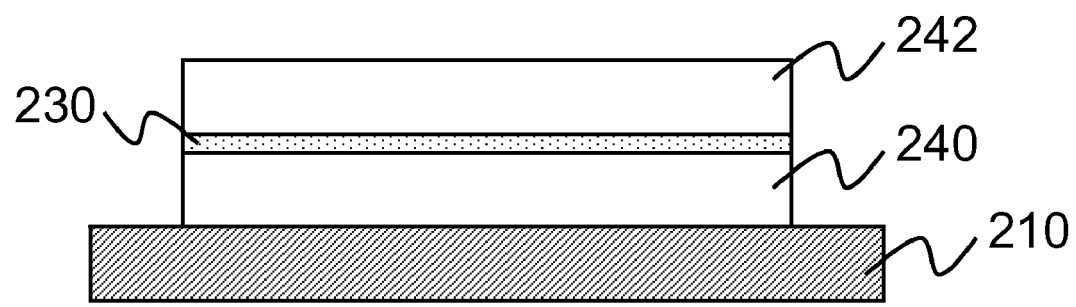
Figure 15C:
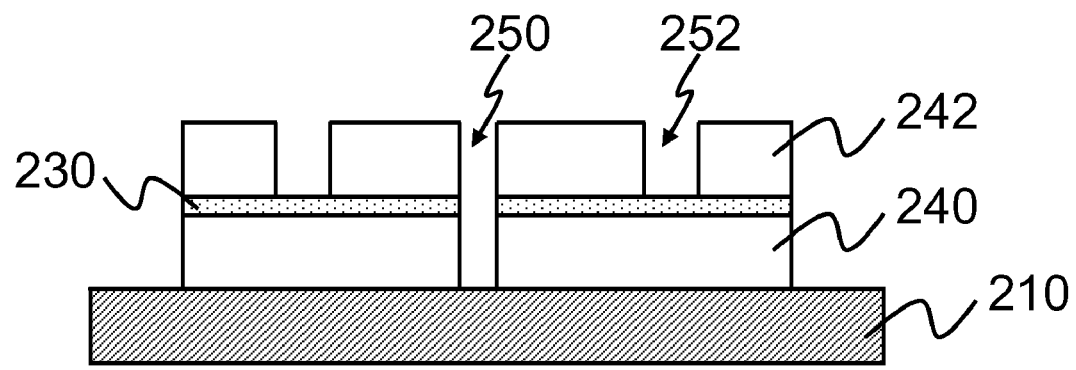
Figure 15D:
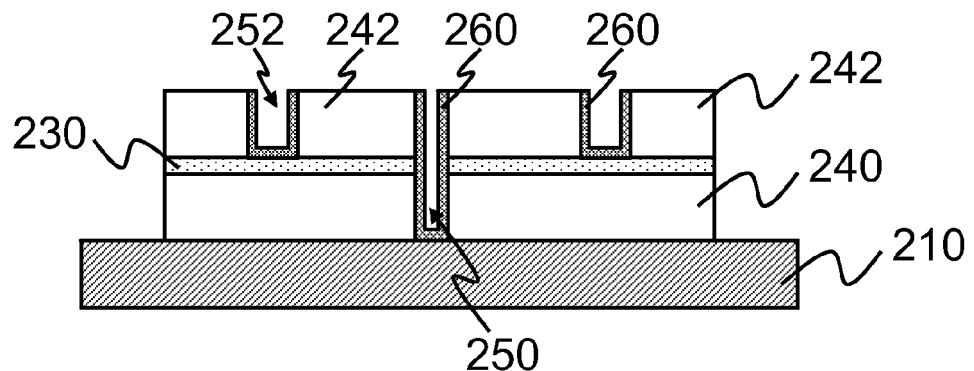
Figure 15E:
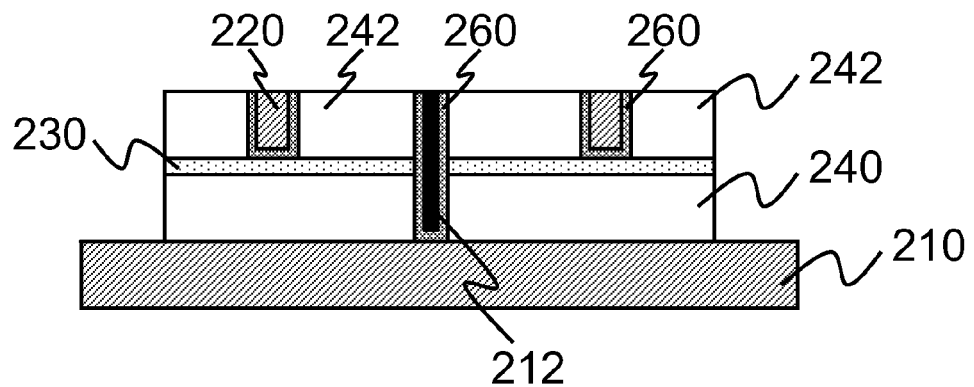
Figure 15F:
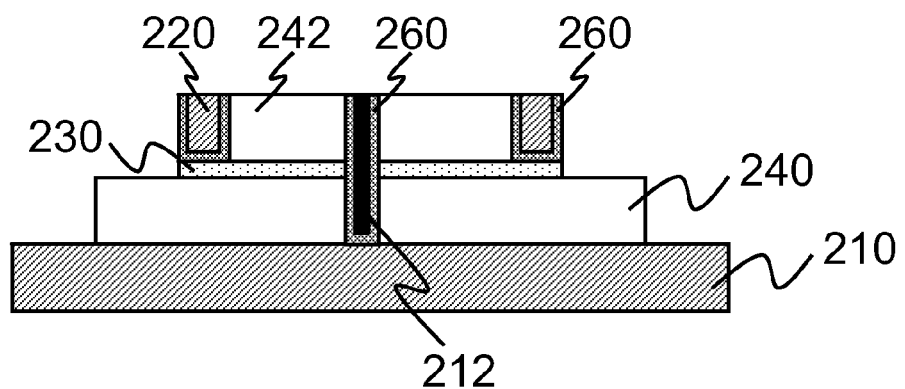
Figure 15G:
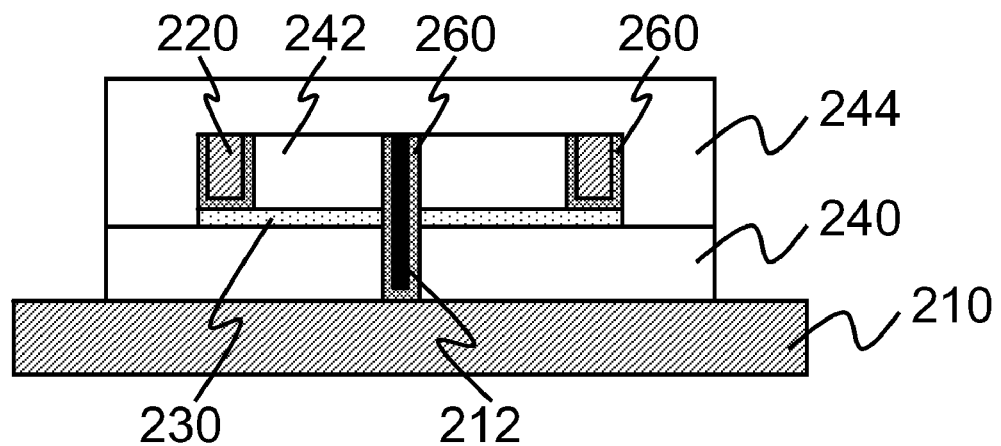

Furthermore, a diffusion barrier layer 260 is formed respectively between the phase change layer 230 and the heating electrode 212 and between the phase change layer 230 and the second electrode 220, so as to prevent the metal materials from diffusing there-between, as shown in FIGS. 15A to 15G. In other words, after the ring via 252 and the center via 250 are formed (shown in FIG. 15C), a diffusion barrier layers 260 is formed on the inside surfaces of the ring via 252 and the center via 250 respectively, as shown in FIG. 15D. Then, a second electrode 220 is formed on the diffusion barrier layer 260 within the ring via 252, and a heating electrode 212 is formed on the diffusion barrier layer 260 within the center via 250, as shown in FIG. 15E. Finally, the third insulating layer 244 corresponding to the second electrode 220 in the structure shown in FIG. 15G is etched away to expose the second electrode 220, such that the device shown in FIG. 6 is obtained. In other words, the third insulating layer 244 on the second electrode 220 in the structure shown in FIG. 15G is removed, so as to expose the second electrode 220.

Furthermore, the ring via is formed after the third insulating layer is formed, and the second electrode is fabricated.

Figure 16A:
FIGS. 16A to 16G are flow charts of a method of fabricating a PCM device according to the fourth embodiment of the present invention.

Referring to FIGS. 16A to 16G, a first electrode 210 is provided at first, as shown in FIG. 16A.

Figure 16B:
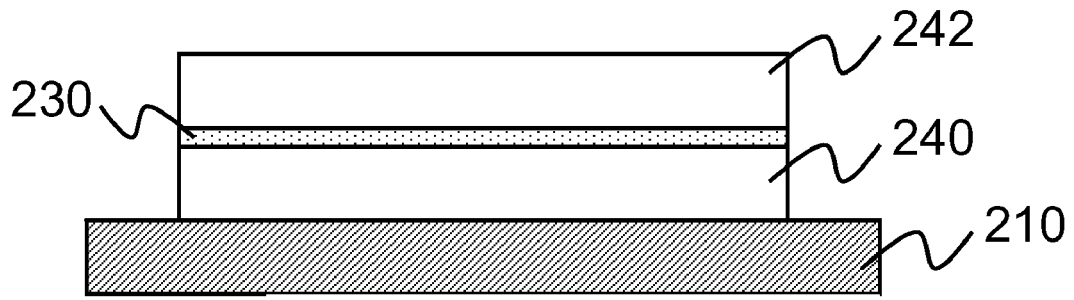

Next, a first insulating layer 240, a phase change layer 230, and a second insulating layer 242 are formed in order on the first electrode 210, as shown in FIG. 16B.

Figure 16C:
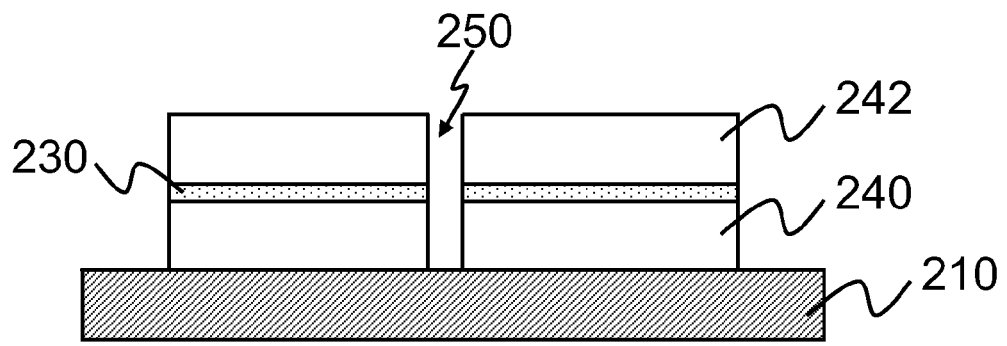

Then, the second insulating layer 242, the phase change layer 230, and the first insulating layer 240 are etched until the first electrode 210 is exposed, so as to form a center via 250 passing through the second insulating layer 242, the phase change layer 230, and the first insulating layer 240, as shown in FIG. 16C.

Figure 16D:
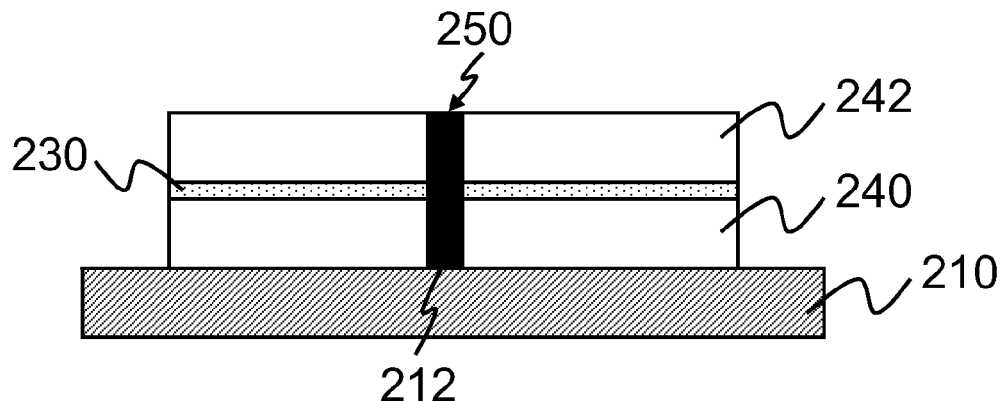

Then, a heating electrode 212 is formed within the center via 250, as shown in FIG. 16D.

Figure 16E:
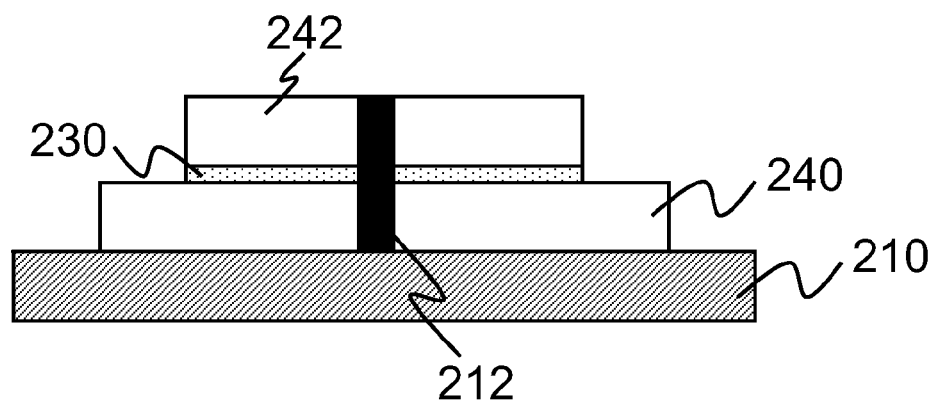
Figure 17A:
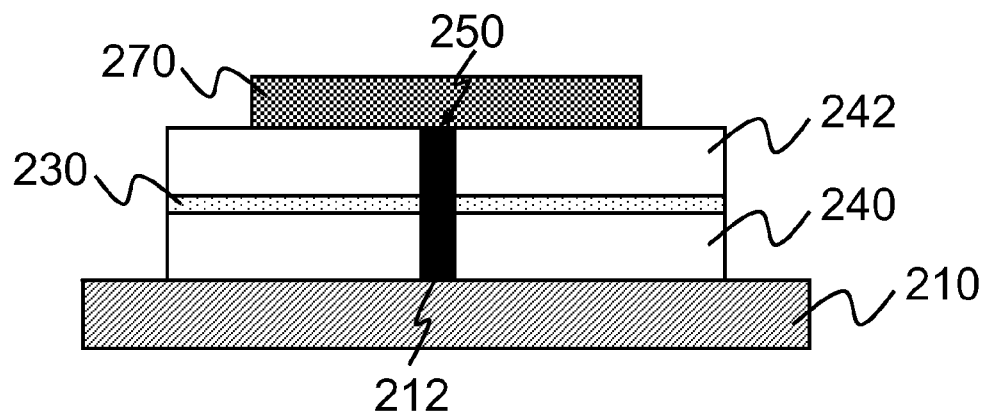
FIGS. 17A and 17B are detailed flow charts of an embodiment of forming the structure as shown in FIG. 16E.
Figure 17B:
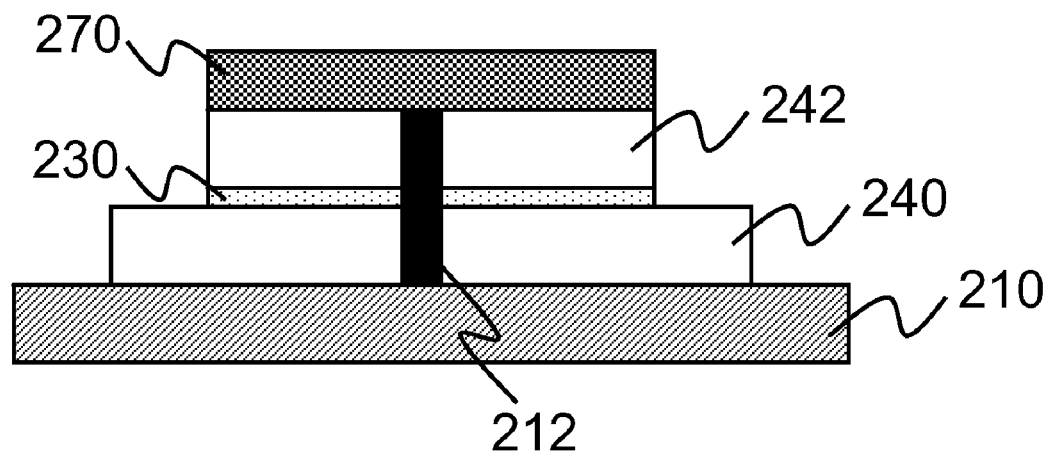

Then, the second insulating layer 242 and the phase change layer 230 are etched, until the first insulating layer 240 is exposed, such that the phase change layer 230 assumes a disk shape, as shown in FIG. 16E. Herein, a disk-shaped photoresist pattern 270 is formed on the second insulating layer 242 in the structure shown in FIG. 16D, wherein the center of the disk shape substantially corresponds to the center via 250, as shown in FIG. 17A. The second insulating layer 242 and the phase change layer 230 at the region without being covered by the photoresist pattern 270 are etched with the photoresist pattern 270 as an etching mask until the corresponding interface of the first insulating layer 240 is exposed, such that the phase change layer 230 assumes a disk shape, as shown in FIG. 17B. Finally, the photoresist pattern 270 is removed, thus obtaining a structure as shown in FIG. 16E.

Figure 16F:
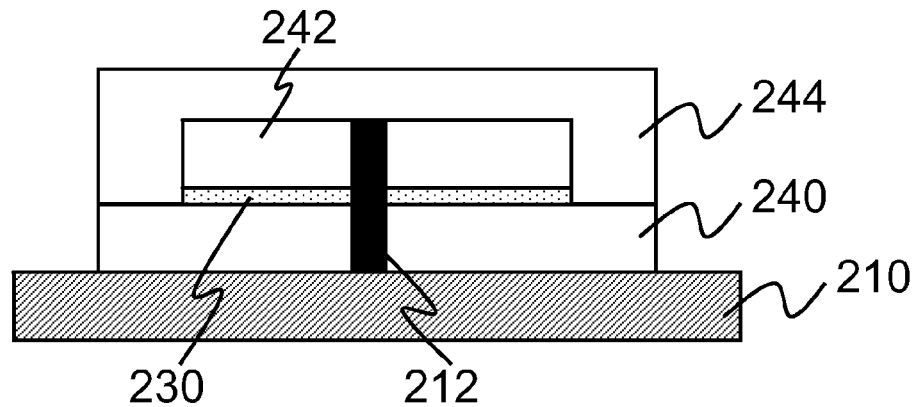

Subsequently, a third insulating layer 244 is formed on the first insulating layer 240 and the second insulating layer 242, for covering the first insulating layer 240 and the second insulating layer 242, as shown in FIG. 16F.

Figure 16G:
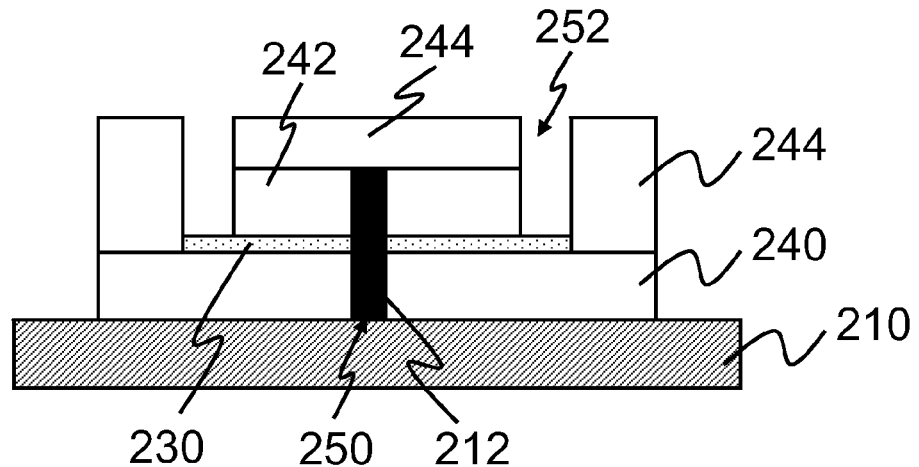
Figure 18A:
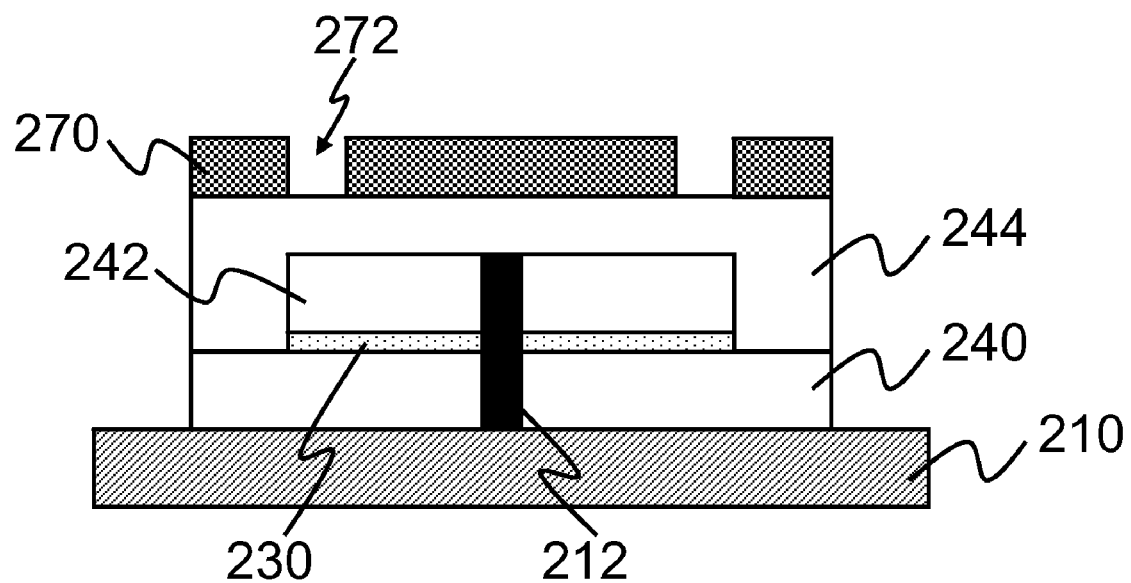
FIGS. 18A and 18B are detailed flow charts of an embodiment of forming a structure as shown in FIG. 16G.
Figure 18B:
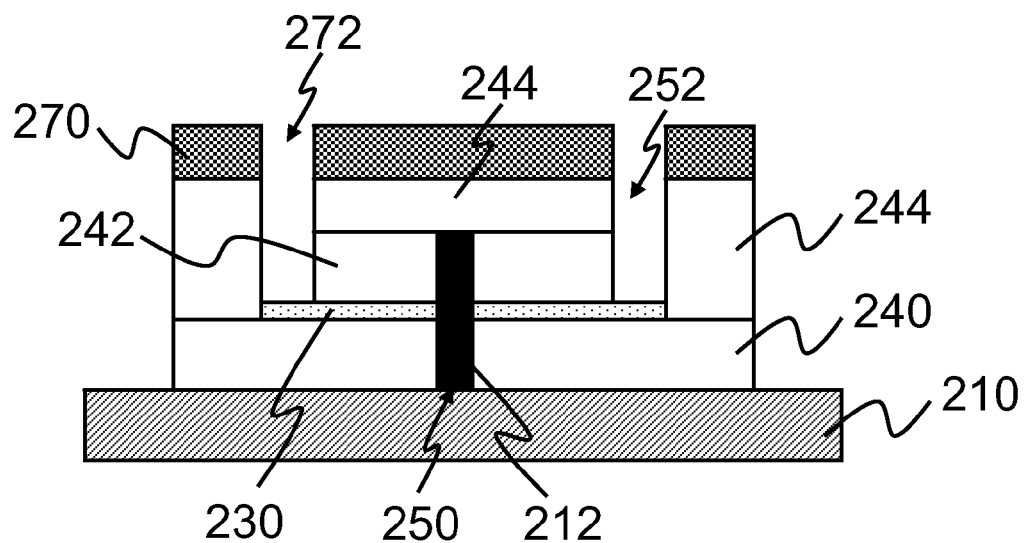

Then, the third insulating layer 244 and the second insulating layer 242 are etched until the phase change layer 230 is exposed, so as to form a ring via 252 passing through the third insulating layer 244 and the second insulating layer 242. The center of the ring via 252 substantially corresponds to the center via 250, and the diameter of the periphery of the ring via 252 is substantially the same as the diameter of the disk shape, that is, the periphery of the disk shape substantially overlaps the periphery of the ring via 252, as shown in FIG. 16G. Herein, a photoresist pattern 270 with a ring hole 272 is formed on the third insulating layer 244 in the structure shown in FIG. 16F at first, wherein the diameter of the periphery of the ring hole 272 is substantially the same as the diameter of the disk shape, that is, the periphery of the ring hole 272 substantially overlaps the edge of the phase change layer 230, and the center of the ring hole 272 substantially corresponds to the center via 250, as shown in FIG. 18A. Then, the third insulating layer 244 and the second insulating layer 242 are etched through the ring hole 272 with the photoresist pattern 270 as an etching mask until the corresponding interface of the phase change layer 230 is exposed, so as to form a ring via 252 passing through the third insulating layer 244 and the second insulating layer 242, as shown in FIG. 18B. Finally, the photoresist pattern 270 is removed, thus obtaining a structure as shown in FIG. 16G.

Finally, a second electrode 220 is formed within the ring via 252, wherein the second electrode 220 assumes a ring shape. In such a way, a structure as shown in FIGS. 5A and 5B is obtained.

Figure 19A:
FIGS. 19A to 19I are flow charts of a method of fabricating a PCM device according to the fifth embodiment of the present invention.
Figure 19B:
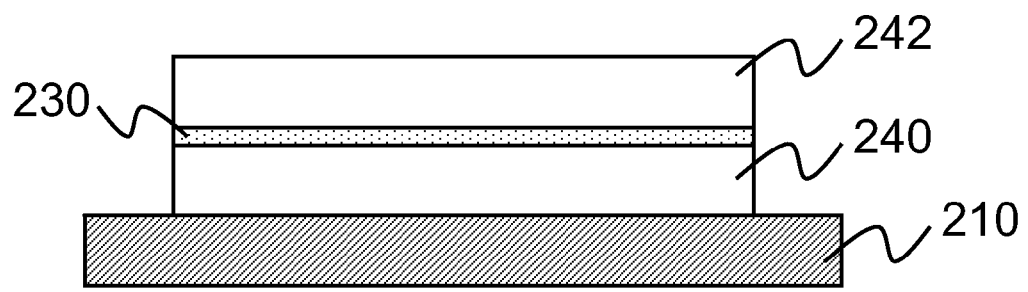
Figure 19C:
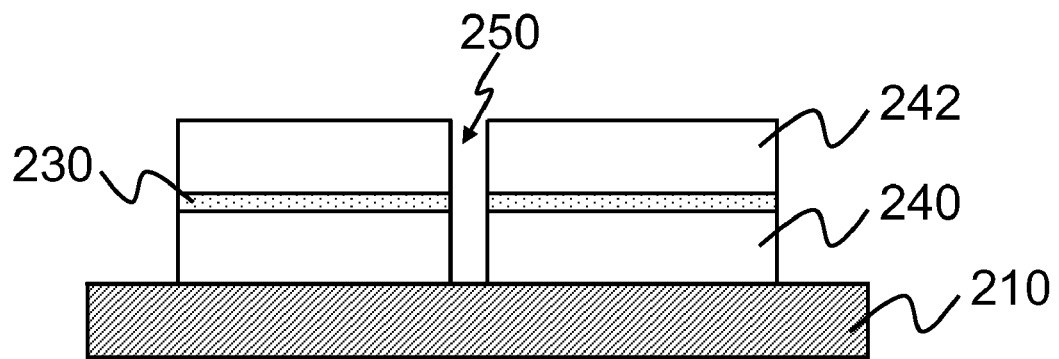
Figure 19D:
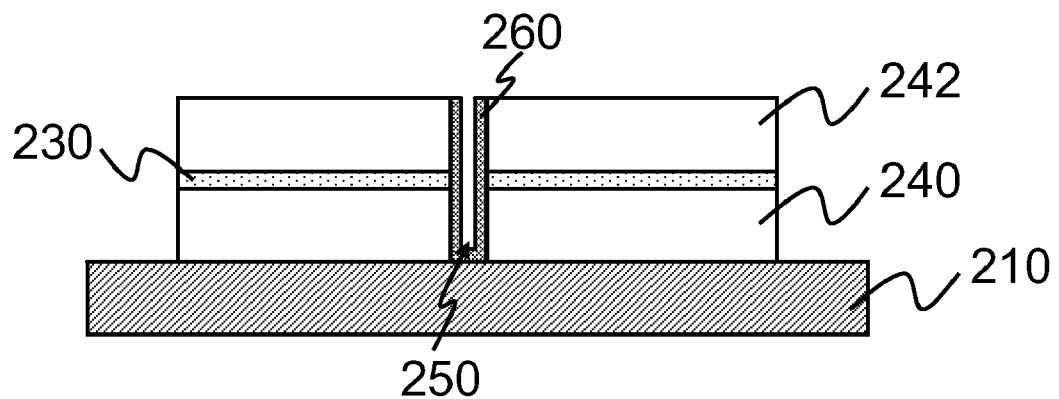
Figure 19E:
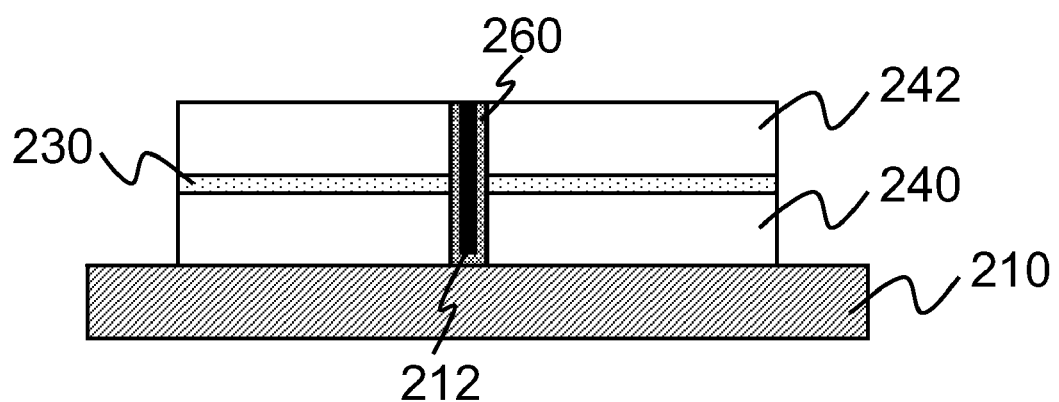
Figure 19F:
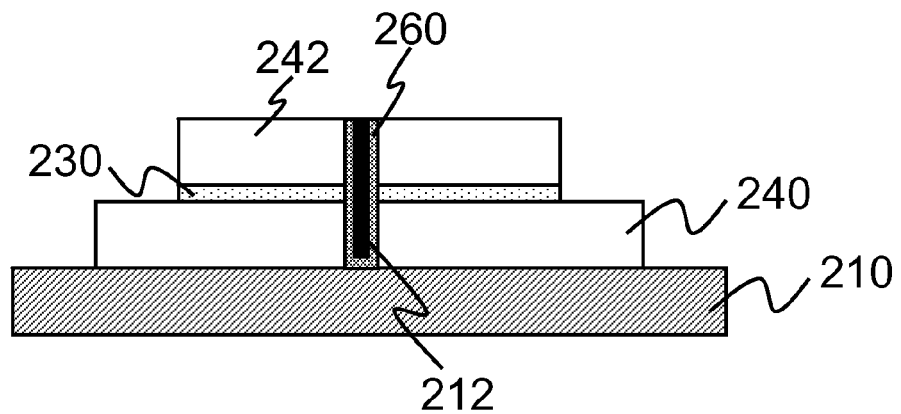
Figure 19G:
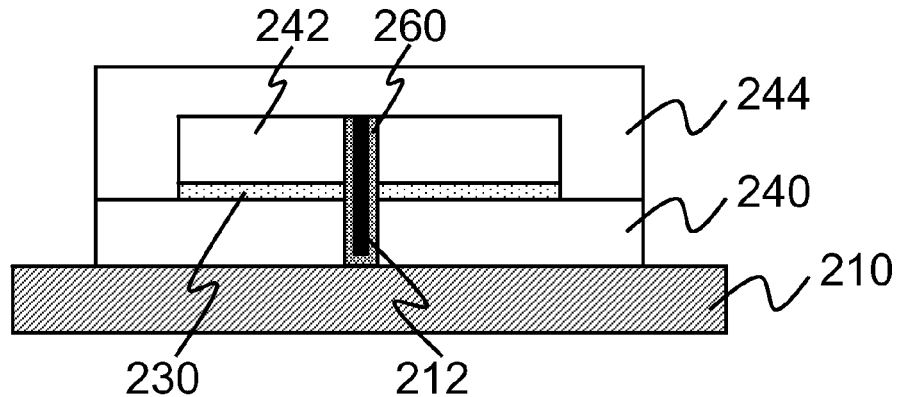
Figure 19H:
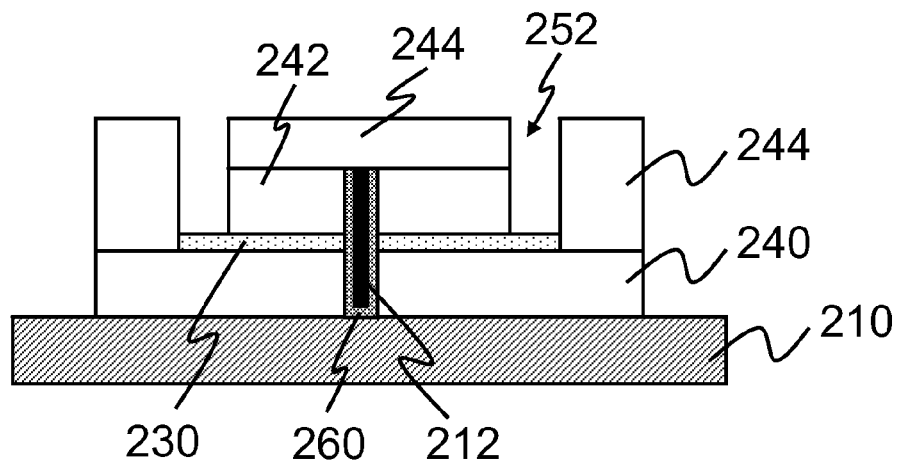
Figure 19I:
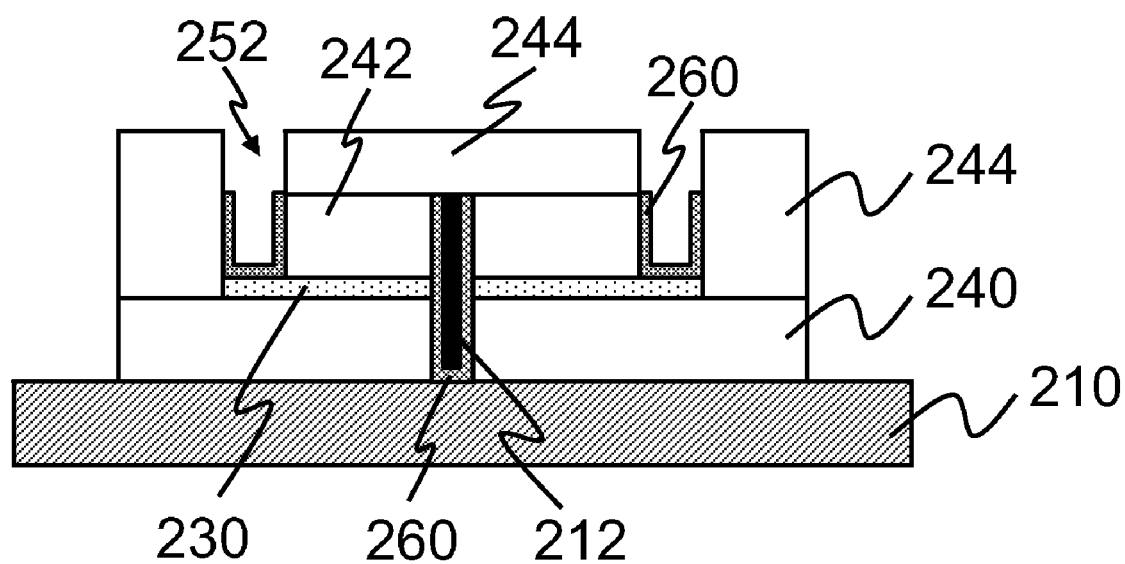

Additionally, a diffusion barrier layer 260 is respectively formed between the phase change layer 230 and the heating electrode 212 and between the phase change layer 230 and the second electrode 220, so as to prevent the metal materials from diffusing there-between, as shown in FIGS. 19A to 19I. In other words, after the center via 250 and the ring via 252 are formed (as shown in FIGS. 19C and 19H), a diffusion barrier layer 260 is respectively formed on the inside surfaces of the center via 250 and the ring via 252, as shown in FIGS. 19D and 19I. Then, a heating electrode 212 is formed on the diffusion barrier layer 260 within the center via 250, as shown in FIG. 19E, and a second electrode 220 is formed on the diffusion barrier layer 260 within the ring via 252, such that a device as shown in FIG. 6 is obtained.

In summary, as for the PCM device of the present invention, the phase change layer assumes a two-dimensional hollow disk shape, such that the heat conduction and the current flowing both are mainly a two-dimensional dissipation or approximately a two-dimensional dissipation. Therefore, the phase change material of the phase change layer is wrapped by an insulating layer for insulating heat, thereby achieving a preferred heat restraining effect.

Furthermore, when fabricating the device, the size of the contact area between the heating electrode and the phase change material is reduced by controlling the thickness of the phase change layer. That is to say, the thickness of the phase change layer is reduced by accurately controlling the thickness of the coating film, thereby reducing the contact area between the heating electrode and the phase change material. In such a way, the device can avoid resistance variation and reduction due to variation of the contact area.

Furthermore, according to the present invention, the process of etching the nanometer hole (i.e., the center via) for disposing the heating electrode and the process of etching away the undesired phase change layer (i.e., the region outside the periphery of the second electrode) is divided into two steps, such that the exposed metal area outside the photoresist pattern is relatively small (only the area of the nanometer hole) when etching the nanometer hole (i.e. the center via). Accordingly, the phenomenon in ordinary metal etching that when the area exposed by the photoresist pattern is too large, the loading is excessively heavy, such that the metal-based polymer is attached around the phase change film (i.e., the phase change layer), is completely eliminated. As the center via is relatively small, no metal-based polymer is expected to be left at the region within the center via after the etching.

Furthermore, when etching away the undesired phase change layer, the metal-based polymer may be left at the edge of the phase change layer, however, which is cleaned with a solvent or even is ignored. It is to say, since the ring-shaped enclosure second electrode is considered as a heat sink, the heat produced by the phase change is dissipated via the ring-shaped enclosure second electrode, which is not transmitted to the metal-based polymer at the edge of the phase change layer to burn out the device or cause damage.

Also, as for the device structure of the present invention, it is possible to change the phase of the entire phase change layer, which is difficult to be achieved in the three-dimensional device structure of the ordinary conventional art.

Moreover, as for the present invention, it is easier and faster in device simulation to make theoretical calculations before the fabrication process than it is for the device structure of the conventional art.

The invention being thus described, it is obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A phase change memory (PCM) device, comprising:
   a first electrode;
   a first insulating layer, located on the first electrode;
   a phase change layer, located on the first insulating layer;
   a second insulating layer, located on the phase change layer, and forming a disk shape with the phase change layer;
   a center via, passing through the first insulating layer, the phase change layer, and the second insulating layer, and substantially corresponding to the center of the disk shape;
   a heating electrode, located in the center via, for performing Joule heating of the phase change layer;
   a third insulating layer, located on the first insulating layer and the second insulating layer, for covering the first insulating layer, the second electrode, and the second insulating layer;
   a ring via, passing through the third insulating layer and the second insulating layer, wherein the periphery of the ring via overlaps the edge of the phase change layer; and
   a second electrode, assuming a ring shape and located in the ring via.

2. The PCM device as claimed in claim 1, further comprising:
   two diffusion barrier layers, located respectively between the phase change layer and the heating electrode and between the phase change layer and the second electrode.

3. The PCM device as claimed in claim 1, wherein the center via and the ring via are formed by an optical lithography process.

4. The PCM device as claimed in claim 3, wherein the optical lithography process is an electron beam direct writing lithography, an advanced ArF lithography, an ArF immersion lithography, or a DUV lithography.

5. The PCM device as claimed in claim 1, wherein the thickness of the first insulating layer is between 10 nm (nanometer) and 5000 nm (nanometer).

6. The PCM device as claimed in claim 1, wherein the thickness of the second insulating layer is between 10 nm and 5000 nm.

7. The PCM device as claimed in claim 1, wherein the thickness of the third insulating layer on the second insulating layer is between 10 nm and 5000 nm.

8. The PCM device as claimed in claim 1, wherein the materials of the first insulating layer, the second insulating layer, and the third insulating layer comprise at least one insulating material.

9. The PCM device as claimed in claim 1, wherein the thickness of the phase change layer is between 1 nm and 300 nm.

10. The PCM device as claimed in claim 1, wherein the phase change layer comprises at least one phase change material film.

11. The PCM device as claimed in claim 1, wherein the heating electrode is a rodlike metal.

12. The PCM device as claimed in claim 1, wherein the diameter of the heating electrode is between 1 nm and 5000 nm.

* * * * *